United States Patent
Nishikawa et al.

(10) Patent No.: US 10,381,376 B1
(45) Date of Patent: Aug. 13, 2019

(54) THREE-DIMENSIONAL FLAT NAND MEMORY DEVICE INCLUDING CONCAVE WORD LINES AND METHOD OF MAKING THE SAME

(71) Applicant: SANDISK TECHNOLOGIES LLC, Addison, TX (US)

(72) Inventors: Masatoshi Nishikawa, Yokkaichi (JP); Xiaolong Hu, Yokkaichi (JP); Yanli Zhang, San Jose, CA (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 16/002,294

(22) Filed: Jun. 7, 2018

(51) Int. Cl.
*H01L 29/792* (2006.01)
*H01L 27/11582* (2017.01)
(Continued)

(52) U.S. Cl.
CPC .......... *H01L 27/11582* (2013.01); *H01L 21/823481* (2013.01); *H01L 21/823487* (2013.01); *H01L 27/1157* (2013.01); *H01L 29/1037* (2013.01)

(58) Field of Classification Search
CPC .......... H01L 27/11582; H01L 27/1157; H01L 21/823481; H01L 21/823487; H01L 29/1037
(Continued)

(56) References Cited

U.S. PATENT DOCUMENTS 9,343,358 B1 * 5/2016 Xu ..................... H01L 21/76877
9,553,146 B2   1/2017 Zhang et al.
(Continued)

FOREIGN PATENT DOCUMENTS

KR   10-2013-0124289 A   11/2013

OTHER PUBLICATIONS

Lue, H.T. et al., "A 128Gb (MLC)/192Gb (TLC) Single-Gate Vertical Channel (SGVC) Architecture 3D NAND using only 16 Layers with Robust Read Disturb, Long-Retention and Excellent Scaling Capability," IEDM Proceedings, pp. IEDM17-461 to IEDM17-464, (2017).
(Continued)

*Primary Examiner* — Tu-Tu V Ho
(74) *Attorney, Agent, or Firm* — The Marbury Law Group PLLC

(57) ABSTRACT

A three-dimensional memory device includes alternating stacks of insulating strips and electrically conductive strips located over a substrate and laterally spaced apart among one another by vertically undulating trenches. The vertically undulating trenches have a greater lateral extent at levels of the electrically conductive strips than at levels of the insulating strips. An interlaced two-dimensional array of memory stack assemblies and dielectric pillar structures are located in the vertically undulating trenches. Each memory stack assembly includes a vertical semiconductor channel and a pair of memory films including a respective pair of convex outer sidewalls that contact, or are spaced by a uniform distance from, concave sidewalls of the electrically conductive strips. Local electrical field at laterally protruding tips of the vertical semiconductor channels are enhanced due to the geometric effect provided by the concave sidewalls of the electrically conductive strips to facilitate faster program and erase operations.

20 Claims, 33 Drawing Sheets

(51) Int. Cl.
  *H01L 29/10*     (2006.01)
  *H01L 21/8234*   (2006.01)
  *H01L 27/1157*   (2017.01)

(58) Field of Classification Search
  USPC ........................................................ 257/324
  See application file for complete search history.

(56) References Cited

U.S. PATENT DOCUMENTS

| | | |
|---|---|---|
| 2002/0068387 A1 | 6/2002 | Tran |
| 2007/0164344 A1 | 7/2007 | Park et al. |
| 2008/0017911 A1 | 1/2008 | Akahori et al. |
| 2008/0219048 A1 | 9/2008 | Lee et al. |
| 2009/0072296 A1 | 3/2009 | Lee et al. |
| 2009/0072297 A1 | 3/2009 | Lee et al. |
| 2012/0139032 A1 | 6/2012 | Akahori et al. |
| 2016/0079257 A1 | 3/2016 | Sonehara et al. |
| 2016/0118391 A1 | 4/2016 | Zhao et al. |
| 2017/0033044 A1* | 2/2017 | Choi ................ H01L 27/11582 |
| 2018/0040630 A1 | 2/2018 | Kamigaichi |

OTHER PUBLICATIONS

International Application No. PCT/US2019/018079, International Search Report and Written Opinion, dated Jun. 14, 2019, 14pgs.

* cited by examiner

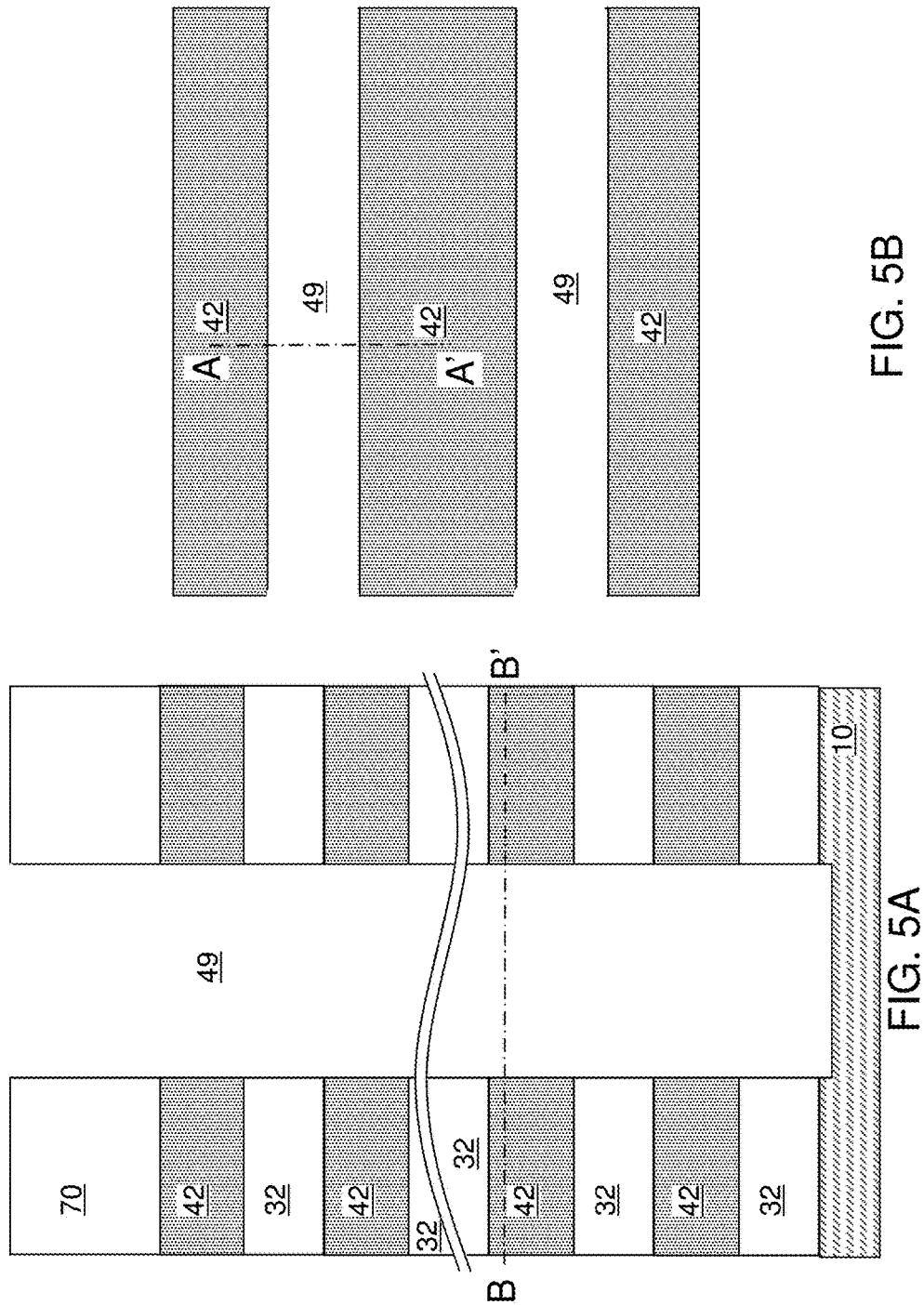

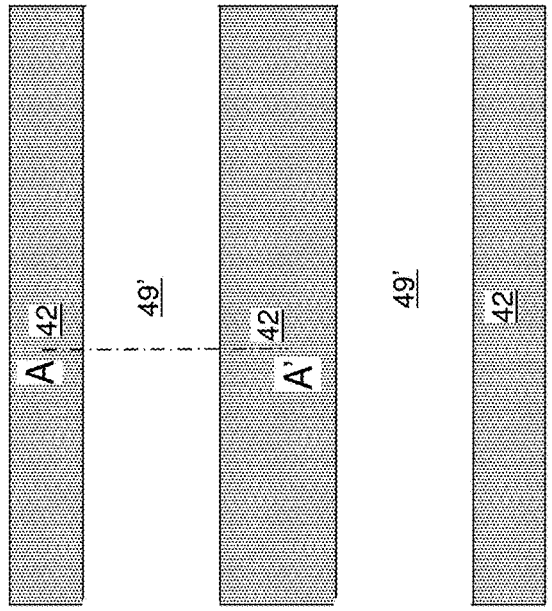
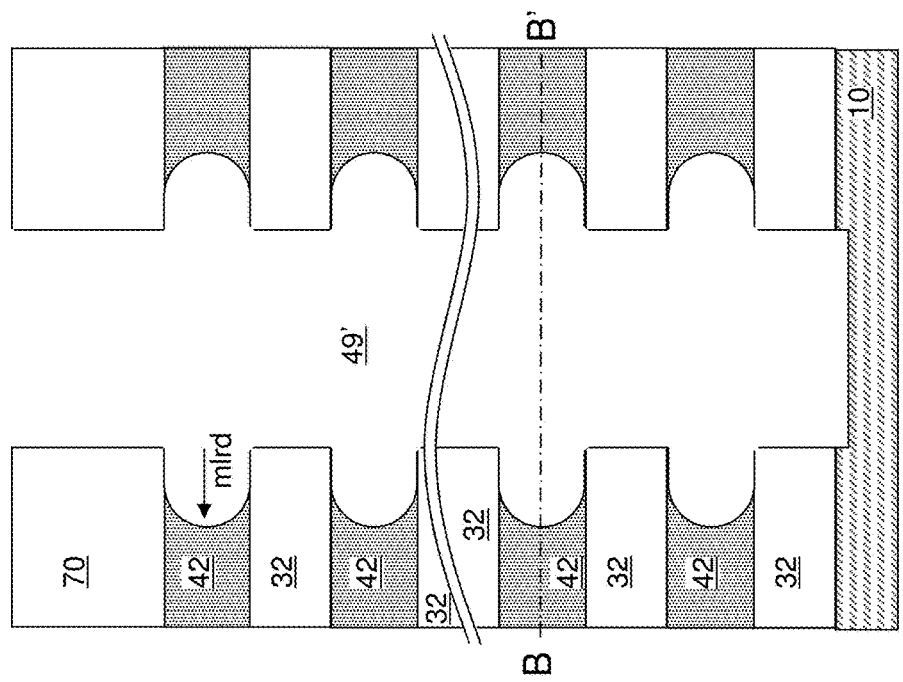
FIG. 6B
FIG. 6A

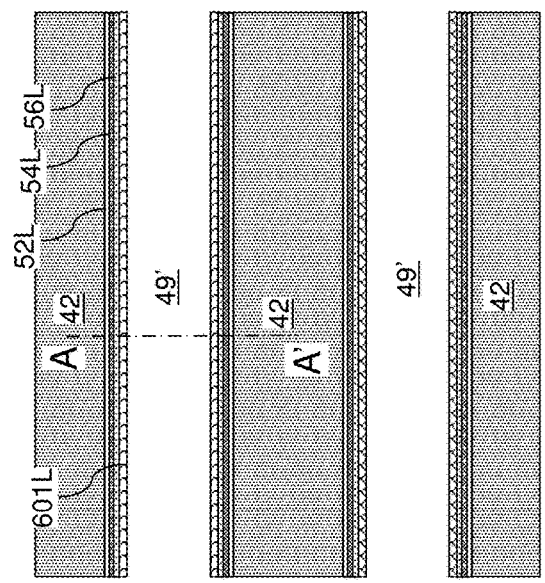
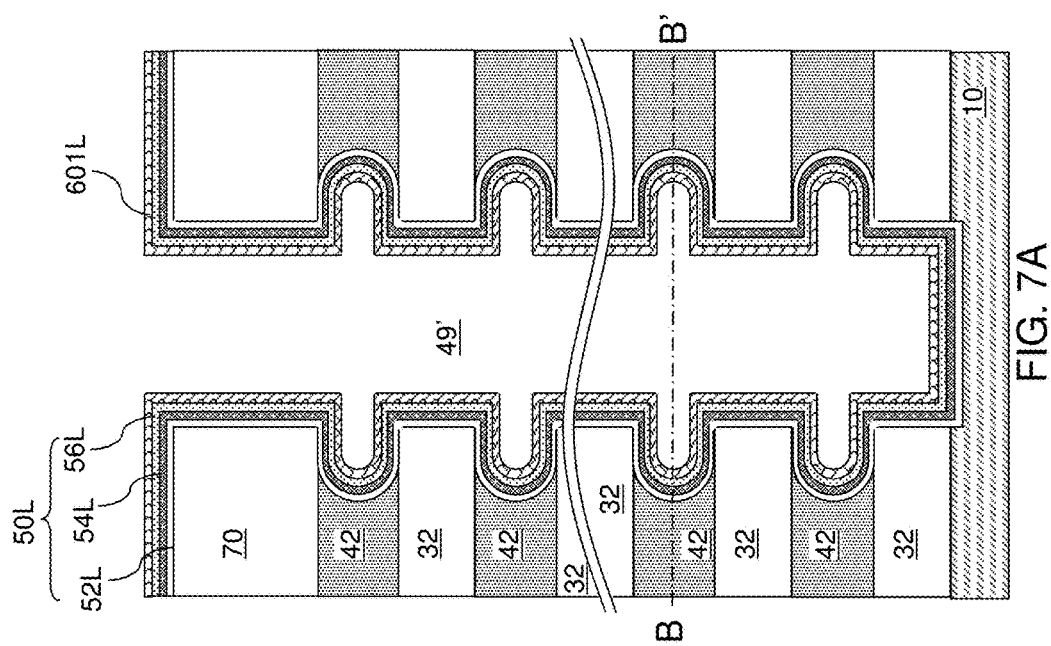
FIG. 7B
FIG. 7A

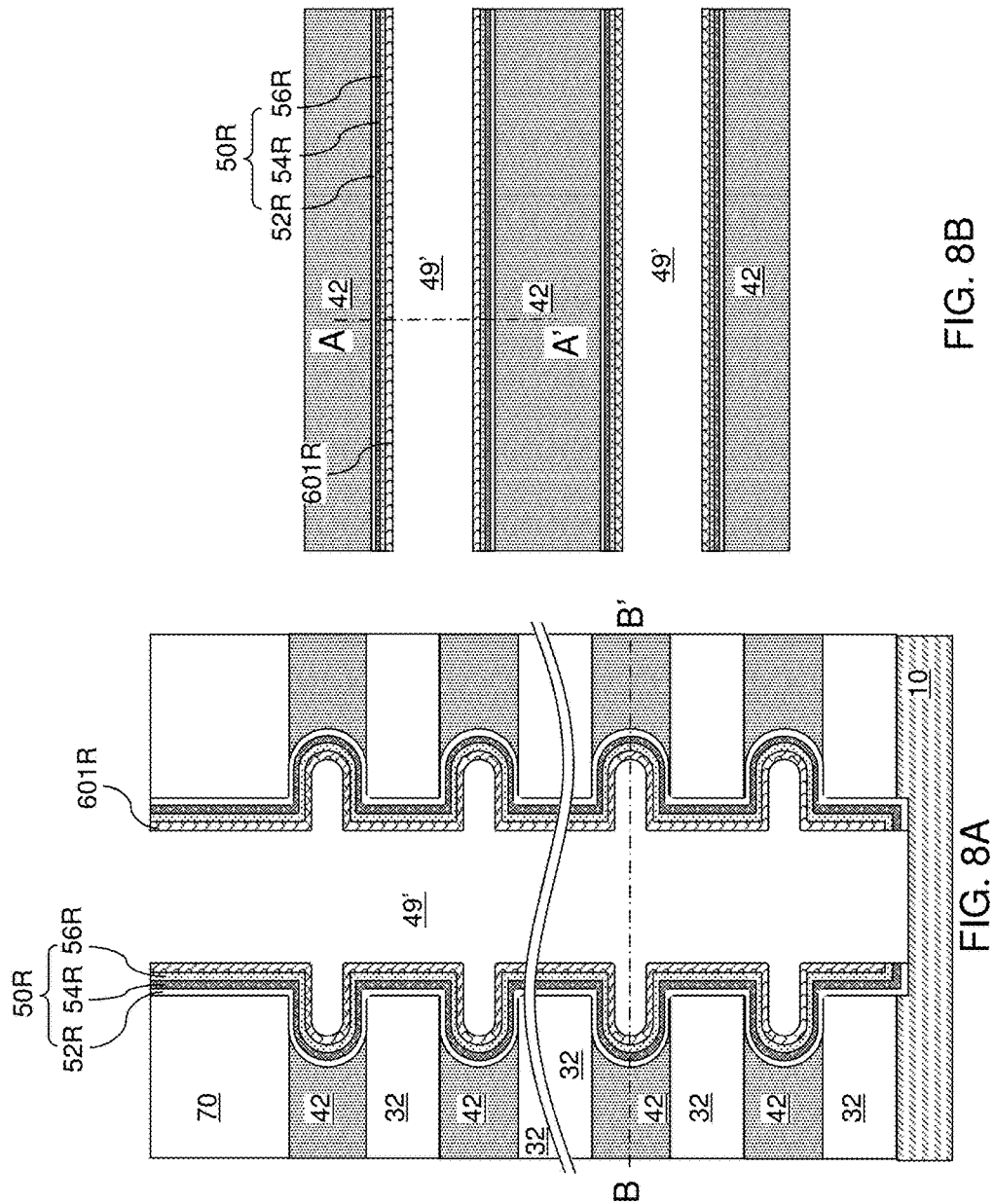

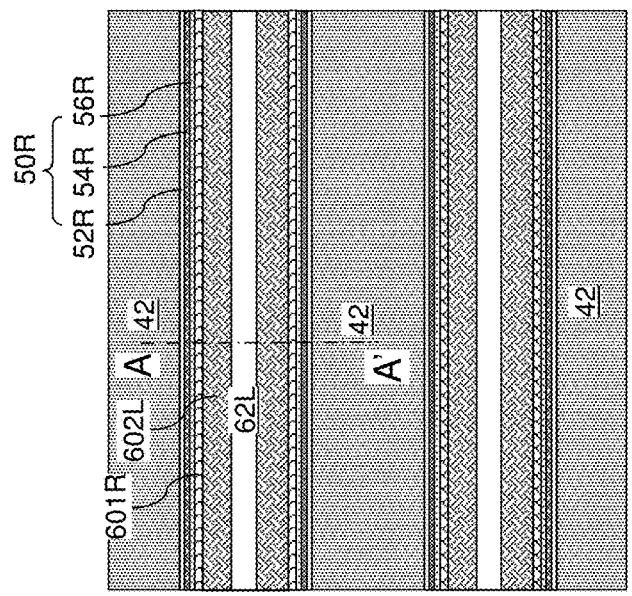
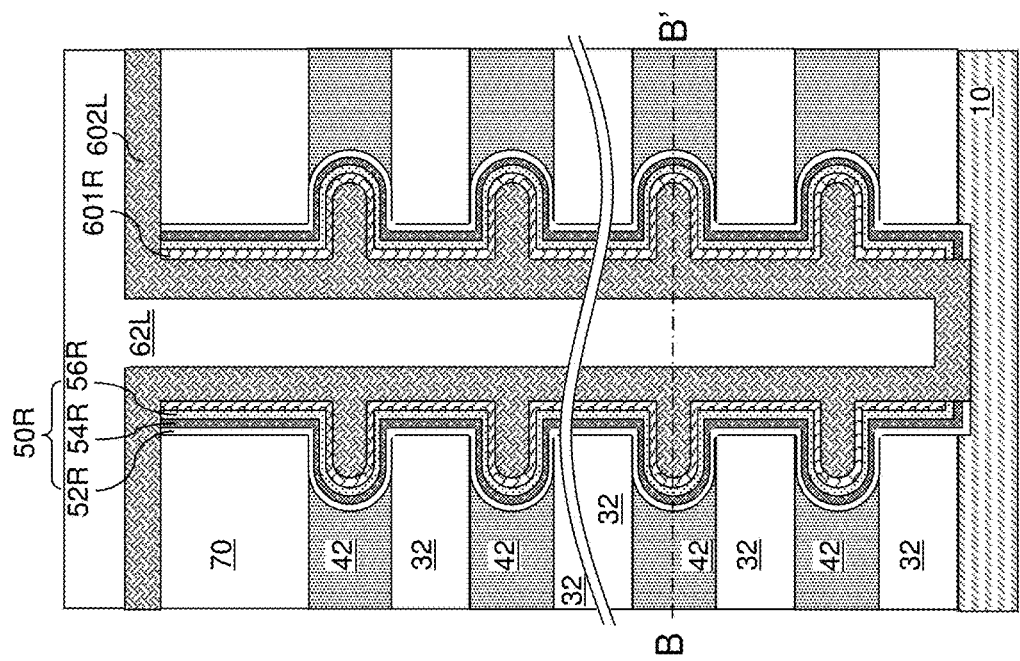
FIG. 9B
FIG. 9A

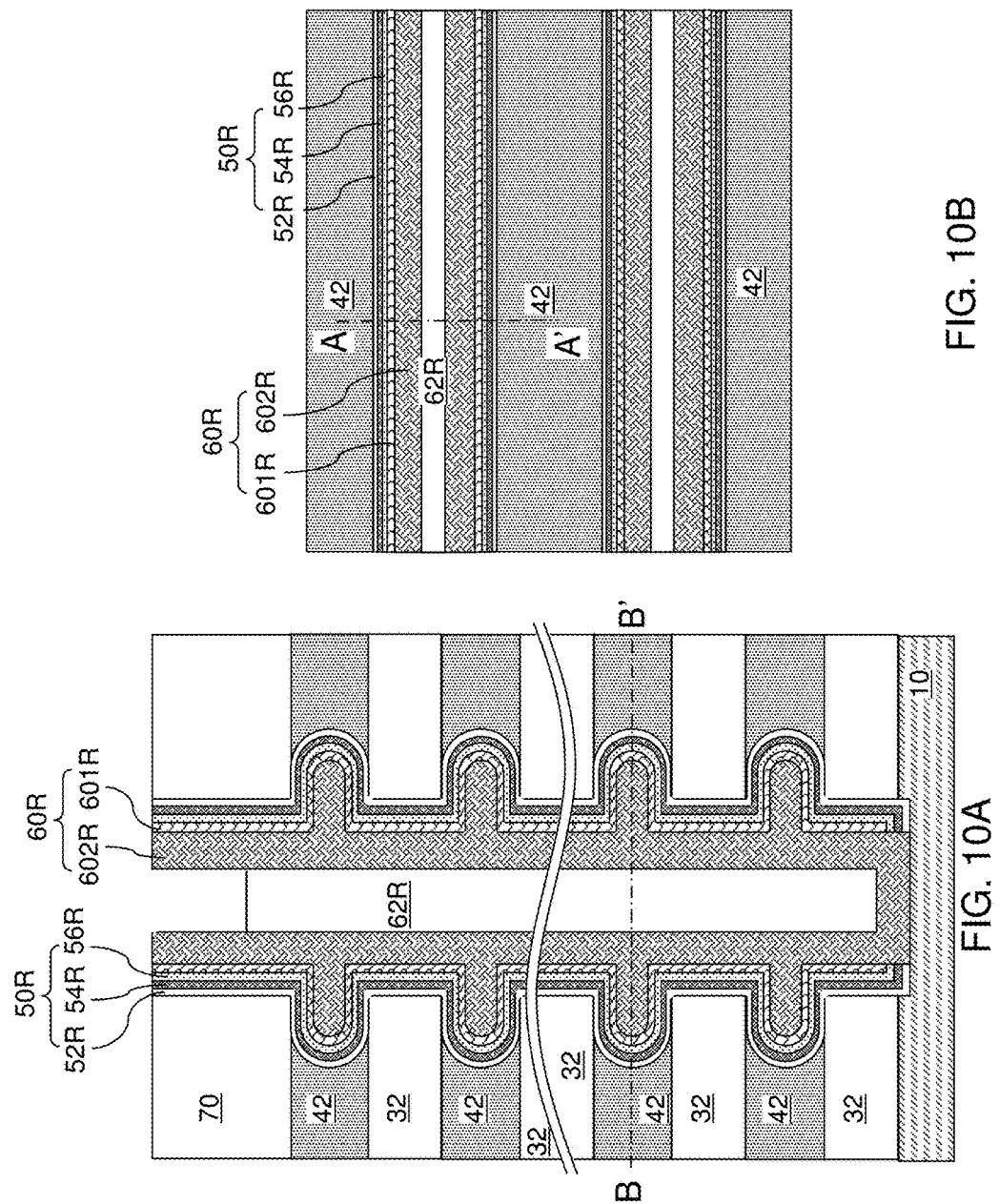

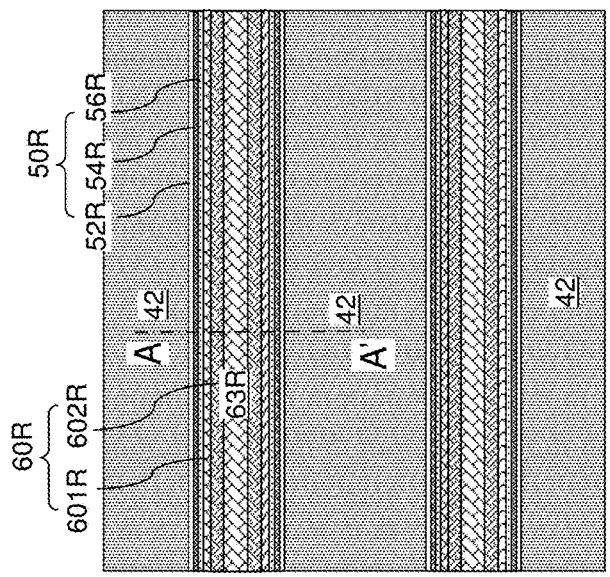
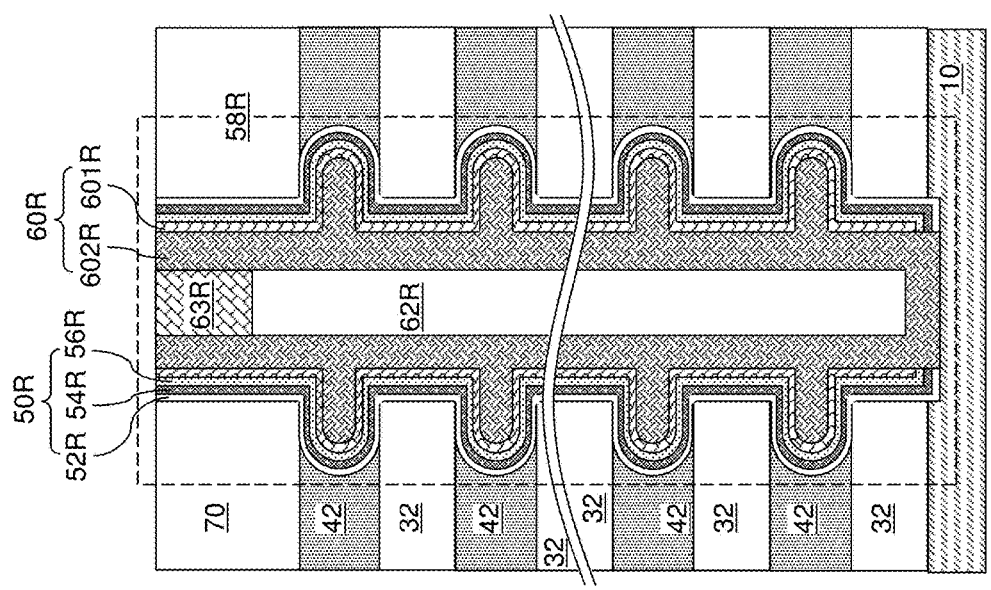
FIG. 11B
FIG. 11A

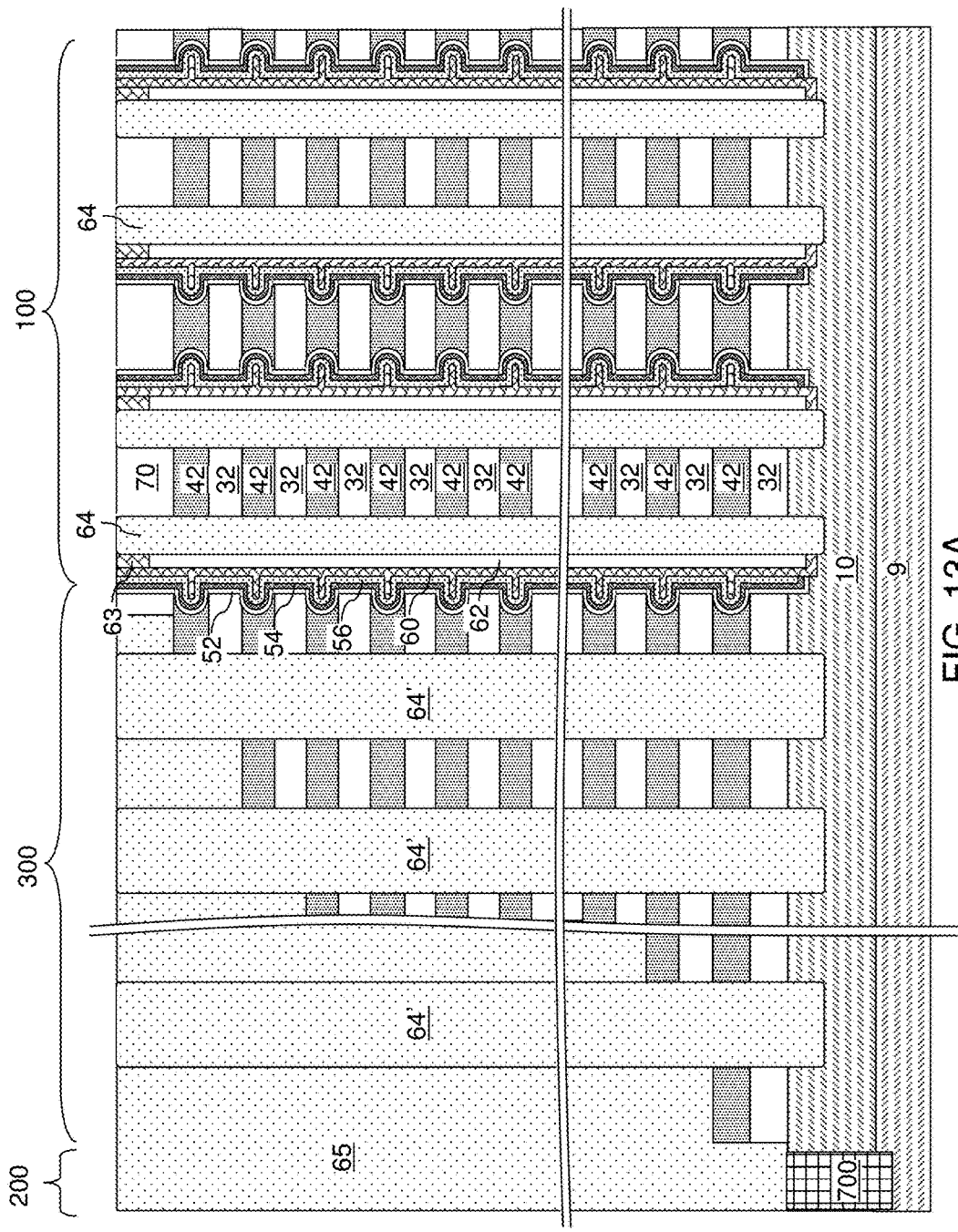

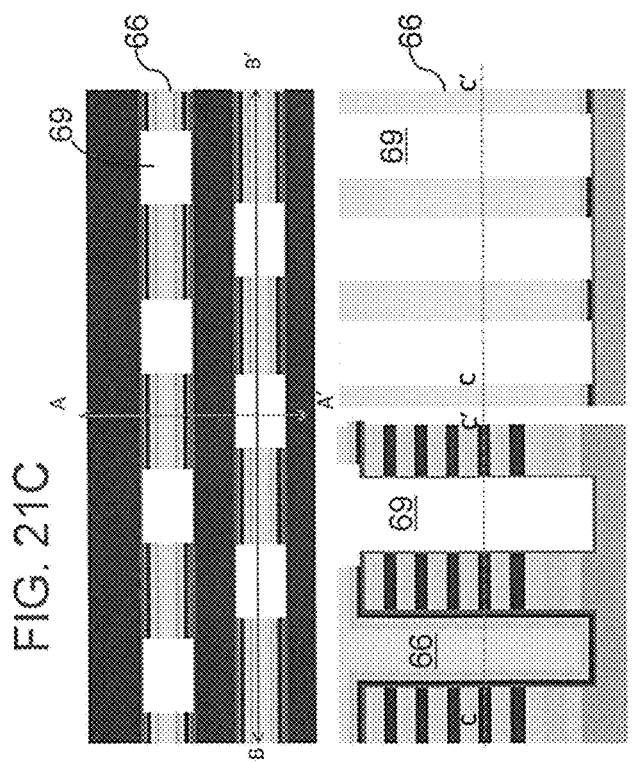
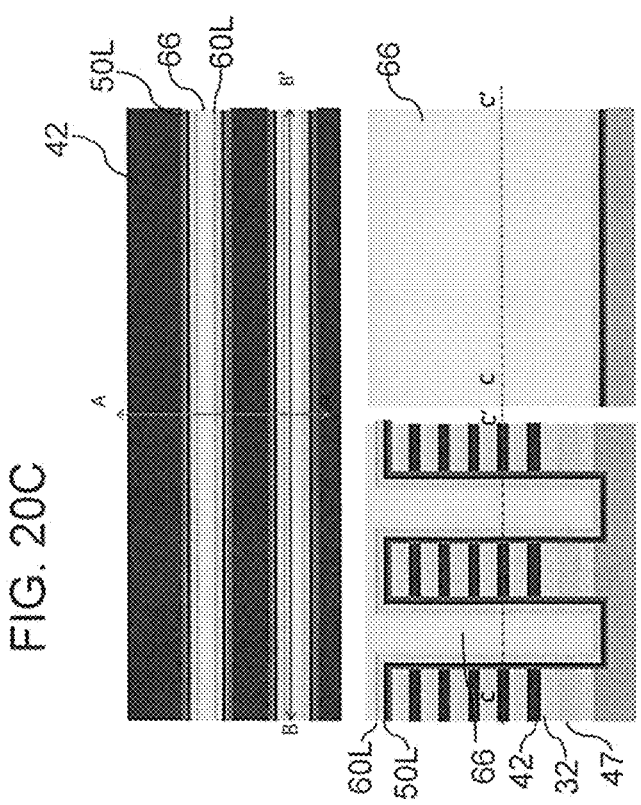

THREE-DIMENSIONAL FLAT NAND MEMORY DEVICE INCLUDING CONCAVE WORD LINES AND METHOD OF MAKING THE SAME

FIELD

The present disclosure relates generally to the field of semiconductor devices, and particular to a three-dimensional flat NAND memory device including concave word lines and methods of manufacturing the same.

BACKGROUND

A configuration of a three-dimensional NAND memory device employs flat memory cells in which tunneling dielectrics have flat vertical surfaces. Such flat memory devices are described in an article by Hang-Ting Lue et al., titled "A 128 Gb (MLC)/192 Gb (TLC) Single-gate Vertical Channel (SGVC) Architecture 3D NAND using only 16 Layers with Robust Read Disturb, Long-Retention and Excellent Scaling Capability," IEDM Proceedings (2017) page 461.

SUMMARY

According to an aspect of the present disclosure, a three-dimensional memory device is provided, which comprises: alternating stacks of insulating strips and electrically conductive strips located over a substrate and laterally spaced apart among one another by vertically undulating trenches, wherein the vertically undulating trenches laterally extend along a first horizontal direction and are spaced apart along a second horizontal direction and have a greater lateral extent along the second horizontal direction at levels of the electrically conductive strips than at levels of the insulating strips; and an interlaced two-dimensional array of memory stack assemblies and dielectric pillar structures located in the vertically undulating trenches, wherein each of the vertically undulating trenches is filled with a respective laterally alternating sequence of memory stack assemblies and dielectric pillar structures, wherein each memory stack assembly comprises a vertical semiconductor channel and a pair of memory films including a respective pair of convex outer sidewalls that contact, or are spaced by a uniform distance from, concave sidewalls of the electrically conductive strips.

According to another aspect of the present disclosure, a method of forming a three-dimensional memory device is provided, which comprises: forming a vertically alternating sequence of insulating layers and sacrificial material layers over a substrate; forming line trenches laterally extending along a first horizontal direction through the vertically alternating sequence, wherein alternating stacks of insulating strips and sacrificial material strips are formed by remaining portions of the vertically alternating sequence; forming recessed concave sidewalls on the sacrificial material strips by laterally recessing the sacrificial material strips selective to the insulating strips, wherein the line trenches become vertically undulating trenches having vertically undulating widths within vertical planes perpendicular to the first horizontal direction; forming an interlaced two-dimensional array of memory stack assemblies and dielectric pillar structures located in the vertically undulating trenches, wherein each of the vertically undulating trenches is filled with a respective laterally alternating sequence of memory stack assemblies and dielectric pillar structures; and replacing the sacrificial material strips with electrically conductive strips, wherein each memory stack assembly comprises a vertical semiconductor channel and a pair of memory films including a respective pair of convex outer sidewalls that contact, or are spaced by a uniform distance from, concave sidewalls of the electrically conductive strips.

BRIEF DESCRIPTION OF THE DRAWINGS

FIG. 5A is a vertical cross-sectional view of a line trench in the exemplary structure of FIGS. 4A and 4B.

FIG. 5B is a horizontal cross-sectional view along the plane B-B' of the structure of FIG. 5A. The vertical plane A-A' corresponds to the plane of the vertical cross-sectional view of FIG. 5A.

FIG. 6A is a vertical cross-sectional view of a vertically undulating trench formed by laterally recessing the sacrificial material strips selective to the insulating strips according to an embodiment of the present disclosure.

FIG. 6B is a horizontal cross-sectional view along the plane B-B' of the structure of FIG. 6A. The vertical plane A-A' corresponds to the plane of the vertical cross-sectional view of FIG. 6A.

FIG. 7A is a vertical cross-sectional view of a vertically undulating trench after formation of a continuous blocking dielectric layer, a continuous charge storage layer, and a continuous tunneling dielectric layer, and a continuous cover material layer according to an embodiment of the present disclosure.

FIG. 7B is a horizontal cross-sectional view along the plane B-B' of FIG. 7A. The vertical plane A-A' corresponds to the plane of the vertical cross-sectional view of FIG. 7A.

FIG. 8A is a vertical cross-sectional view of a vertically undulating trench after formation of a pair of blocking dielectric layers, a pair of charge storage layers, a pair of tunneling dielectric layers, and a pair of cover material layers by performing an anisotropic etch process according to an embodiment of the present disclosure.

FIG. 8B is a horizontal cross-sectional view along the plane B-B' of FIG. 8A. The vertical plane A-A' corresponds to the plane of the vertical cross-sectional view of FIG. 8A.

FIG. 9A is a vertical cross-sectional view of a vertically undulating trench after formation of a continuous semiconductor channel material layer and a dielectric core material layer according to an embodiment of the present disclosure.

FIG. 9B is a horizontal cross-sectional view along the plane B-B' of FIG. 9A. The vertical plane A-A' corresponds to the plane of the vertical cross-sectional view of FIG. 9A.

FIG. 10A is a vertical cross-sectional view of a vertically undulating trench after formation of a semiconductor channel material rail and a dielectric core rail therein according to an embodiment of the present disclosure.

FIG. 10B is a horizontal cross-sectional view along the plane B-B' of FIG. 10A. The vertical plane A-A' corresponds to the plane of the vertical cross-sectional view of FIG. 10A.

FIG. 11A is a vertical cross-sectional view of a vertically undulating trench after formation of a drain region rail therein according to an embodiment of the present disclosure.

FIG. 11B is a horizontal cross-sectional view along the plane B-B' of FIG. 11A. The vertical plane A-A' corresponds to the plane of the vertical cross-sectional view of FIG. 11A.

FIG. 13A is a vertical cross-sectional view of the exemplary structure after formation of dielectric pillar structures in the isolation cavities according to an embodiment of the present disclosure.

FIGS. 20A and 20B are schematic vertical cross-sectional views of a subsequent step in a method of forming the second exemplary structure according to a second embodiment of the present disclosure along vertical planes A-A' and B-B', respectively in FIG. 20C. FIG. 20C is a side cross-cross sectional view of the second exemplary structure along plane C-C' in FIGS. 20A and 20B.

FIGS. 21A and 21B are schematic vertical cross-sectional views of a subsequent step in a method of forming the second exemplary structure according to the second embodiment of the present disclosure along vertical planes A-A' and B-B', respectively in FIG. 21C. FIG. 21C is a side cross-cross sectional view of the second exemplary structure along plane C-C' in FIGS. 21A and 21B.

DETAILED DESCRIPTION

Figure 1:
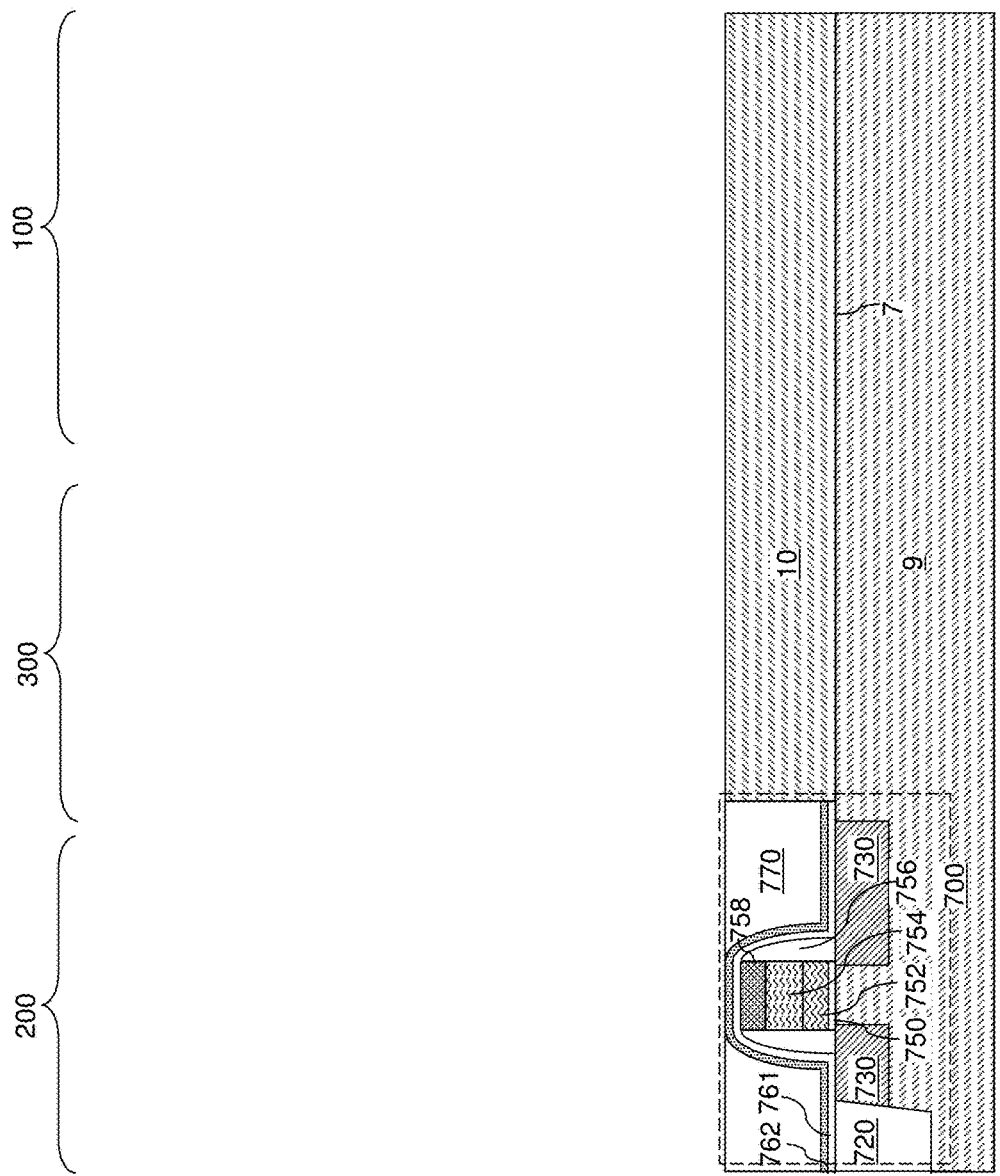
FIG. 1 is a schematic vertical cross-sectional view of an exemplary structure after formation of at least one peripheral device and a semiconductor material layer according to an embodiment of the present disclosure.

The present inventors realized that prior art flat memory cells described in the Lue et al. article have a slow program and erase speed than cylindrical memory cells with surrounding control gate electrodes because the control gate electrodes do not provide an encircling configuration.

In view of the above, embodiments of the present disclosure provide a memory device having an undulating vertical channel located in trenches with vertically undulating sidewalls, which provide a curvature between the vertical channel and the control gate electrodes. The embodiment device configuration provides a higher program and erase speed. Thus, the embodiments of the present disclosure are directed to three-dimensional memory devices including device including flat NAND memory cells and methods of manufacturing the same, the various aspects of which are described below. The embodiments of the disclosure can be employed to form various structures including a multilevel memory structure, non-limiting examples of which include semiconductor devices such as three-dimensional monolithic memory array devices comprising a plurality of NAND memory strings.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The same reference numerals refer to the same element or similar element. Unless otherwise indicated, elements having the same reference numerals are presumed to have the same composition. As used herein, a first element located "on" a second element can be located on the exterior side of a surface of the second element or on the interior side of the second element. As used herein, a first element is located "directly on" a second element if there exist a physical contact between a surface of the first element and a surface of the second element.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The various three-dimensional memory devices of the present disclosure include a monolithic three-dimensional NAND string memory device, and can be fabricated employing the various embodiments described herein.

Generally, a semiconductor die, or a semiconductor package, can include a memory chip. Each semiconductor package contains one or more dies (for example one, two, or four). The die is the smallest unit that can independently execute commands or report status. Each die contains one or more planes (typically one or two). Identical, concurrent operations can take place on each plane, although with some restrictions. Each plane contains a number of blocks, which are the smallest unit that can be erased by in a single erase operation. Each block contains a number of pages, which are the smallest unit that can be programmed, i.e., a smallest unit on which a read operation can be performed.

Referring to FIG. 1, an exemplary structure according to an embodiment of the present disclosure is illustrated, which can be employed, for example, to fabricate a device structure containing vertical NAND memory devices. The exemplary structure includes a substrate (9, 10), which can be a semiconductor substrate. The substrate can include a substrate semiconductor layer 9 and an optional semiconductor material layer 10. The substrate semiconductor layer 9 maybe a semiconductor wafer or a semiconductor material layer, and can include at least one elemental semiconductor material (e.g., single crystal silicon wafer or layer), at least one III-V compound semiconductor material, at least one II-VI compound semiconductor material, at least one organic semiconductor material, or other semiconductor materials known in the art. The substrate can have a major surface 7, which can be, for example, a topmost surface of the substrate semiconductor layer 9. The major surface 7 can be a semiconductor surface. In one embodiment, the major surface 7 can be a single crystalline semiconductor surface, such as a single crystalline semiconductor surface.

As used herein, a "semiconducting material" refers to a material having electrical conductivity in the range from $1.0 \times 10^{-6}$ S/cm to $1.0 \times 10^{5}$ S/cm. As used herein, a "semiconductor material" refers to a material having electrical conductivity in the range from $1.0 \times 10^{-6}$ S/cm to $1.0 \times 10^{5}$ S/cm in the absence of electrical dopants therein, and is capable of producing a doped material having electrical conductivity in a range from $1.0$ S/cm to $1.0 \times 10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/cm. As used herein, an "insulator material" or a "dielectric material" refers to a material having electrical conductivity less than $1.0 \times 10^{-6}$ S/cm. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0 \times 10^{5}$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-6}$ S/cm to $1.0 \times 10^{5}$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

At least one semiconductor device 700 for a peripheral circuitry can be formed on a portion of the substrate semiconductor layer 9. The at least one semiconductor device can include, for example, field effect transistors. For example, at least one shallow trench isolation structure 720 can be formed by etching portions of the substrate semiconductor layer 9 and depositing a dielectric material therein. A gate dielectric layer, at least one gate conductor layer, and a gate cap dielectric layer can be formed over the substrate semiconductor layer 9, and can be subsequently patterned to form at least one gate structure (750, 752, 754, 758), each of which can include a gate dielectric 750, a gate electrode (752, 754), and a gate cap dielectric 758. The gate electrode (752, 754) may include a stack of a first gate electrode portion 752 and a second gate electrode portion 754. At least one gate spacer 756 can be formed around the at least one gate structure (750, 752, 754, 758) by depositing and anisotropically etching a dielectric liner. Active regions 730 can be formed in upper portions of the substrate semiconductor layer 9, for example, by introducing electrical dopants employing the at least one gate structure (750, 752, 754, 758) as masking structures. Additional masks may be employed as needed. The active region 730 can include source regions and drain regions of field effect transistors. A first dielectric liner 761 and a second dielectric liner 762 can be optionally formed. Each of the first and second dielectric liners (761, 762) can comprise a silicon oxide layer, a silicon nitride layer, and/or a dielectric metal oxide layer. As used herein, silicon oxide includes silicon dioxide as well as non-stoichiometric silicon oxides having more or less than two oxygen atoms for each silicon atoms. Silicon dioxide is preferred. In an illustrative example, the first dielectric liner 761 can be a silicon oxide layer, and the second dielectric liner 762 can be a silicon nitride layer. The least one semiconductor device for the peripheral circuitry can contain a driver circuit for memory devices to be subsequently formed, which can include at least one NAND device.

A dielectric material such as silicon oxide can be deposited over the at least one semiconductor device, and can be subsequently planarized to form a planarization dielectric layer 770. In one embodiment the planarized top surface of the planarization dielectric layer 770 can be coplanar with a top surface of the dielectric liners (761, 762). Subsequently, the planarization dielectric layer 770 and the dielectric liners (761, 762) can be removed from an area to physically expose a top surface of the substrate semiconductor layer 9. As used herein, a surface is "physically exposed" if the surface is in physical contact with vacuum, or a gas phase material (such as air).

The optional semiconductor material layer 10, if present, can be formed on the top surface of the substrate semiconductor layer 9 prior to, or after, formation of the at least one semiconductor device 700 by deposition of a single crystalline semiconductor material, for example, by selective epitaxy. The deposited semiconductor material can be the same as, or can be different from, the semiconductor material of the substrate semiconductor layer 9. The deposited semiconductor material can be any material that can be employed for the substrate semiconductor layer 9 as described above. The single crystalline semiconductor material of the semiconductor material layer 10 can be in epitaxial alignment with the single crystalline structure of the substrate semiconductor layer 9. Portions of the deposited semiconductor material located above the top surface of the planarization dielectric layer 770 can be removed, for example, by chemical mechanical planarization (CMP). In this case, the semiconductor material layer 10 can have a top surface that is coplanar with the top surface of the planarization dielectric layer 770. In one embodiment, the semiconductor material layer 10 can have a doping of a first conductivity type.

The region (i.e., area) of the at least one semiconductor device 700 is herein referred to as a peripheral device region 200. The region in which a memory array is subsequently formed is herein referred to as a memory array region 100. A contact region 300 for subsequently forming stepped terraces of electrically conductive strips can be provided between the memory array region 100 and the peripheral device region 200.

Figure 2:
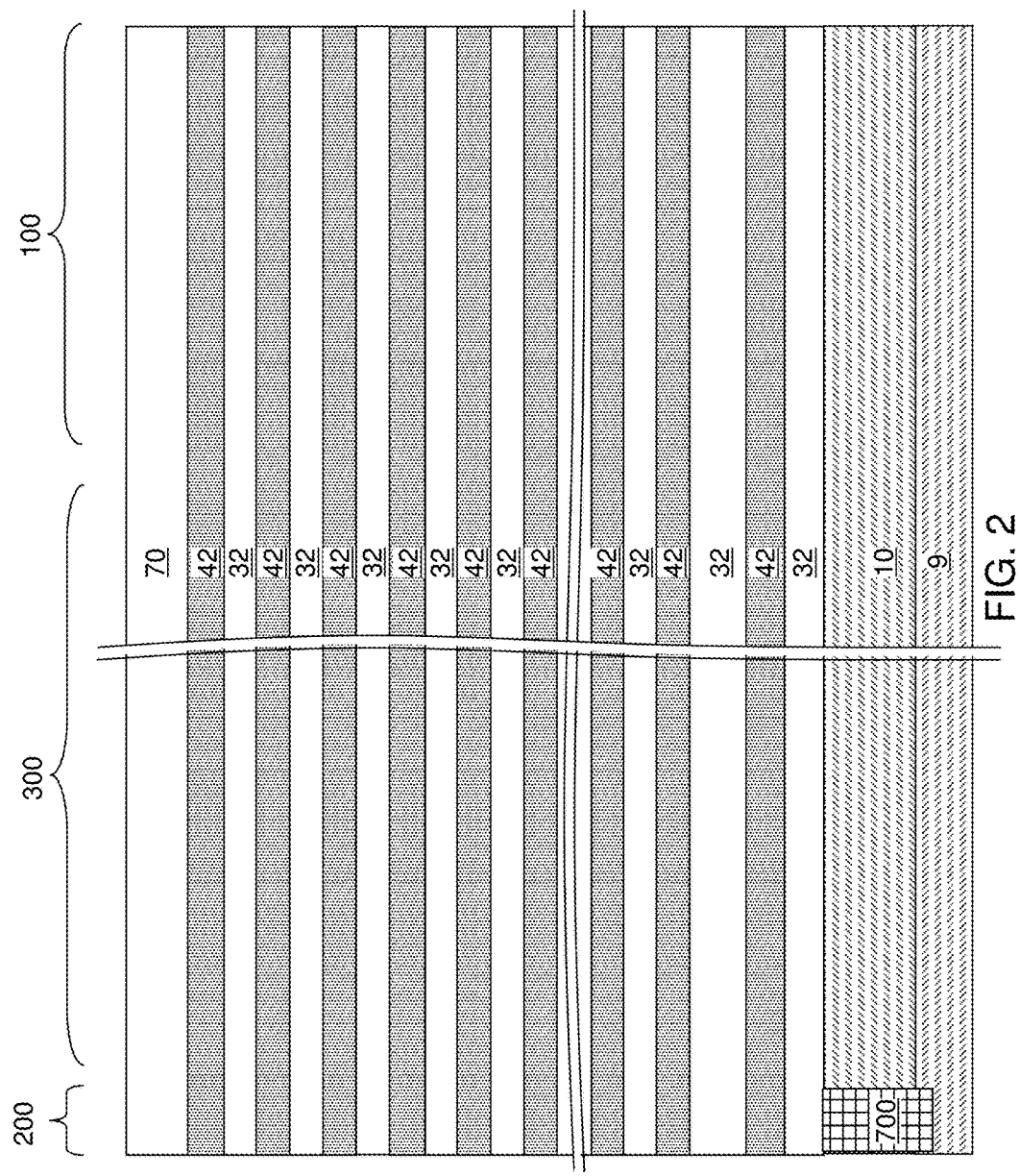
FIG. 2 is a schematic vertical cross-sectional view of the exemplary structure after formation of a vertically alternating sequence of insulating layers and spacer material layers according to an embodiment of the present disclosure.

Referring to FIG. 2, a vertically alternating sequence of first material layers (such as insulating layers 32) and second material layers (such as spacer material layers) is formed over the substrate (9, 10). As used herein, a "vertically alternating sequence" refers to an alternating sequence of multiple instances of a first element and multiple instances of a second element that alternate vertically such that an instance of the second element overlies and/or underlies each instance of the first element, and an instance of the first element overlies and/or underlies each instance of the second element. The vertically alternating sequence can include a stack of an alternating plurality of first material layers (which can be insulating layers 32) and second material layers (which can be sacrificial material layer 42). As used herein, a "material layer" refers to a layer including a material throughout the entirety thereof. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. Thus, a vertically alternating sequence of first elements and second elements is an alternating plurality of the first elements and the second elements in which the alternating of the first elements and second elements occurs along the vertical direction. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulating layer 32, and each second material layer can be a sacrificial material layer. In this case, the stack can include an alternating plurality of insulating layers 32 and sacrificial material layers 42, and constitutes a prototype stack of alternating layers comprising insulating layers 32 and sacrificial material layers 42. As used herein, a "prototype" structure or an "in-process" structure refers to a transient structure that is subsequently modified in the shape or composition of at least one component therein.

In one embodiment, the vertically alternating sequence (32, 42) can include insulating layers 32 composed of the first material, and sacrificial material layers 42 composed of a second material different from that of insulating layers 32. The first material of the insulating layers 32 can be at least one insulating material. As such, each insulating layer 32 can be an insulating material layer. Insulating materials that can be employed for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 can be silicon oxide.

The second material of the sacrificial material layers 42 is a sacrificial material that can be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an insulating material, a semiconductor material, or a conductive material. The second material of the sacrificial material layers 42 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 can be spacer material layers that comprise silicon nitride or a semiconductor material including at least one of silicon and germanium.

In one embodiment, the insulating layers 32 can include silicon oxide, and sacrificial material layers can include silicon nitride sacrificial material layers. The first material of the insulating layers 32 can be deposited, for example, by chemical vapor deposition (CVD). For example, if silicon oxide is employed for the insulating layers 32, tetraethyl orthosilicate (TEOS) can be employed as the precursor material for the CVD process. The second material of the sacrificial material layers 42 can be formed, for example, CVD or atomic layer deposition (ALD).

The sacrificial material layers 42 can be suitably patterned so that conductive material portions to be subsequently formed by replacement of the sacrificial material layers 42 can function as electrically conductive electrodes, such as the control gate electrodes of the monolithic three-dimensional NAND string memory devices to be subsequently formed. The sacrificial material layers 42 may comprise a portion having a strip shape extending substantially parallel to the major surface 7 of the substrate.

The thicknesses of the insulating layers 32 and the sacrificial material layers 42 can be in a range from 20 nm to 50 nm, although lesser and greater thicknesses can be employed for each insulating layer 32 and for each sacrificial material layer 42. The number of repetitions of the pairs of an insulating layer 32 and a sacrificial material layer (e.g., a control gate electrode or a sacrificial material layer) 42 can be in a range from 2 to 1,024, and typically from 8 to 256, although a greater number of repetitions can also be employed. The top and bottom gate electrodes in the stack may function as the select gate electrodes. In one embodiment, each sacrificial material layer 42 in the vertically alternating sequence (32, 42) can have a uniform thickness that is substantially invariant within each respective sacrificial material layer 42.

While the present disclosure is described employing an embodiment in which the spacer material layers are sacrificial material layers 42 that are subsequently replaced with electrically conductive strips, embodiments are expressly contemplated herein in which the sacrificial material layers are formed as electrically conductive strips. In this case, steps for replacing the spacer material layers with electrically conductive strips can be omitted.

Optionally, an insulating cap layer 70 can be formed over the vertically alternating sequence (32, 42). The insulating cap layer 70 includes a dielectric material that is different from the material of the sacrificial material layers 42. In one embodiment, the insulating cap layer 70 can include a dielectric material that can be employed for the insulating layers 32 as described above. The insulating cap layer 70 can have a greater thickness than each of the insulating layers 32. The insulating cap layer 70 can be deposited, for example, by chemical vapor deposition. In one embodiment, the insulating cap layer 70 can be a silicon oxide layer.

Figure 3:
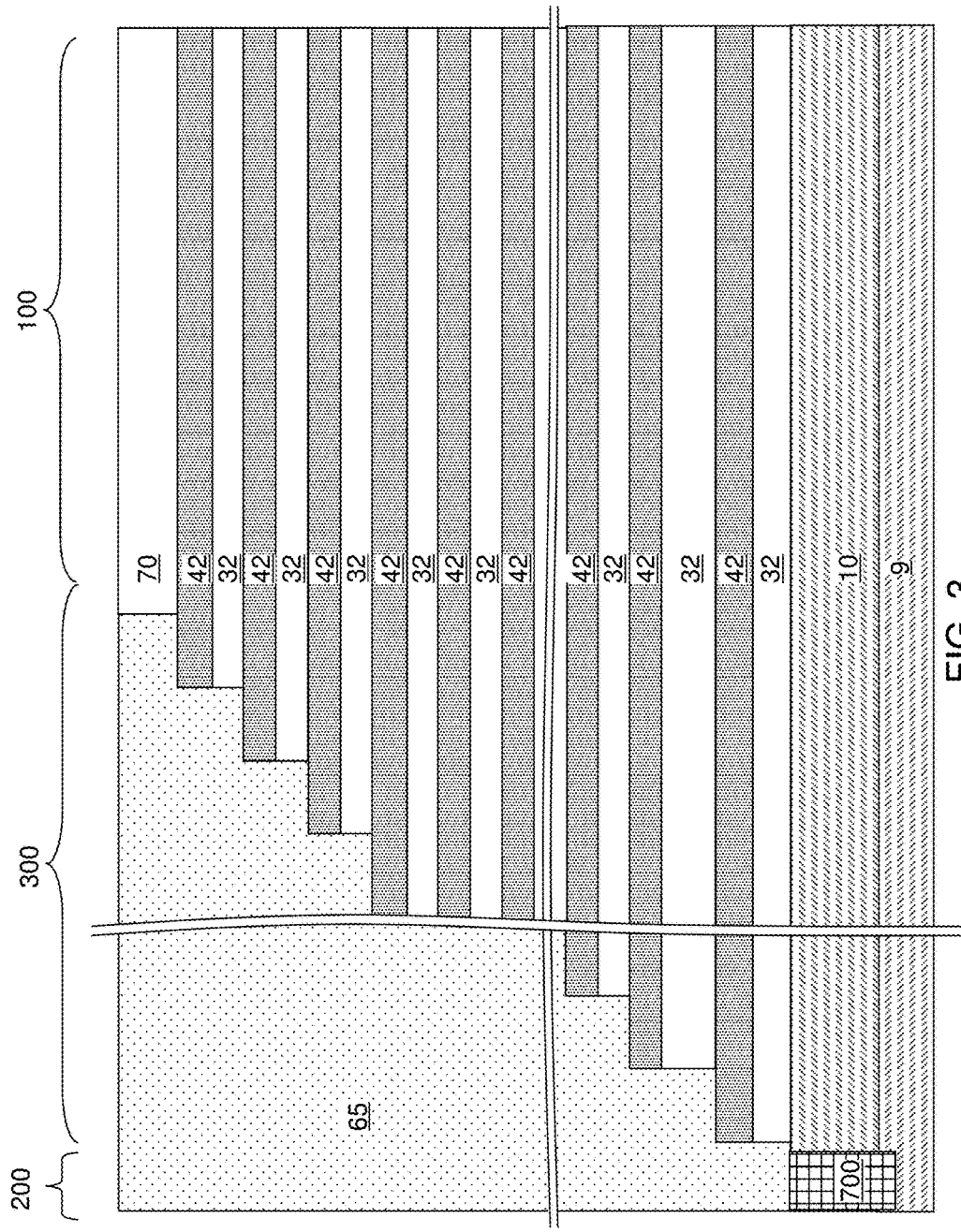
FIG. 3 is a schematic vertical cross-sectional view of the exemplary structure after formation of stepped terraces and a retro-stepped dielectric material portion according to an embodiment of the present disclosure.
Figure 4A:
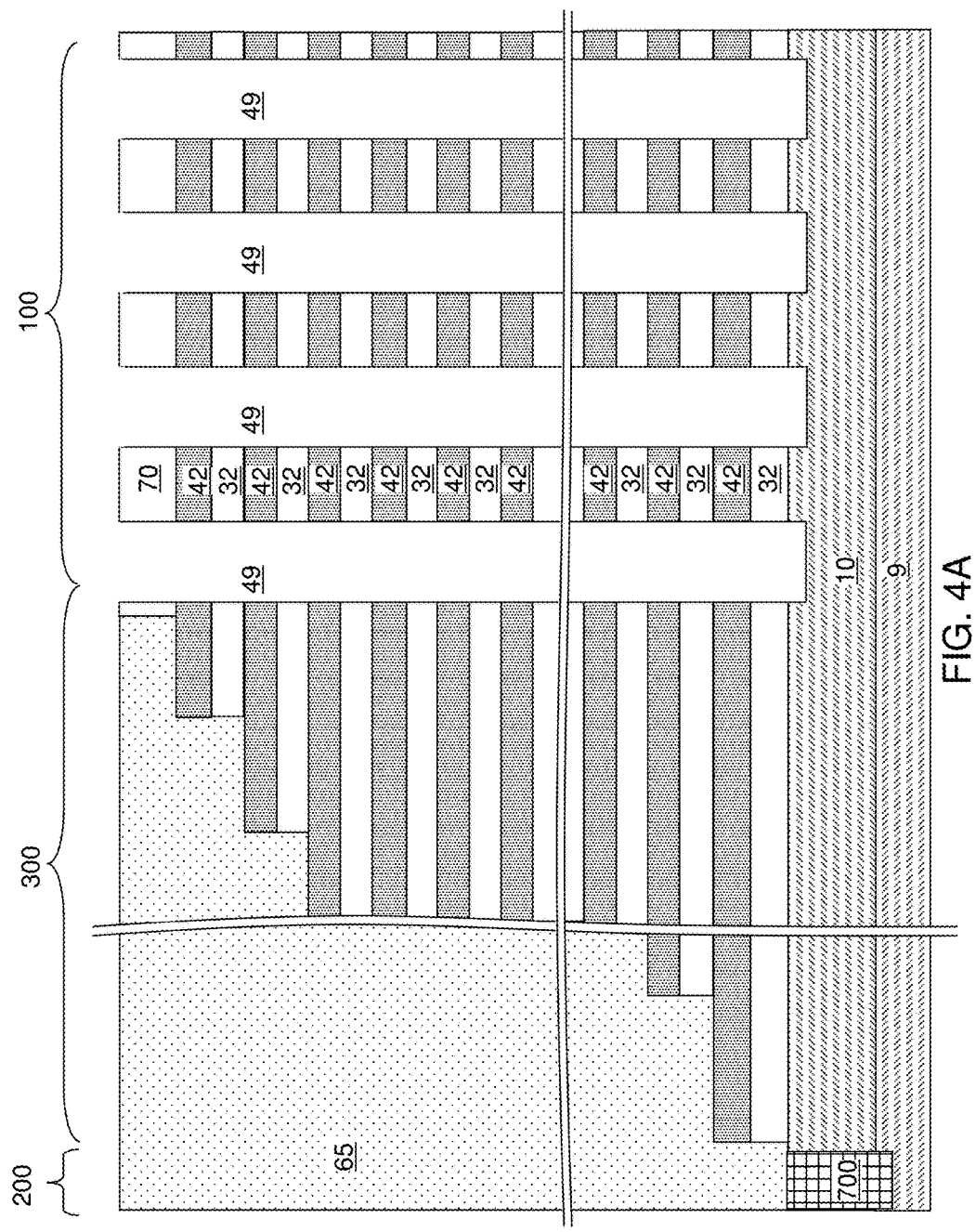
FIG. 4A is a schematic vertical cross-sectional view of the exemplary structure after formation of line trenches according to an embodiment of the present disclosure.
Figure 4B:
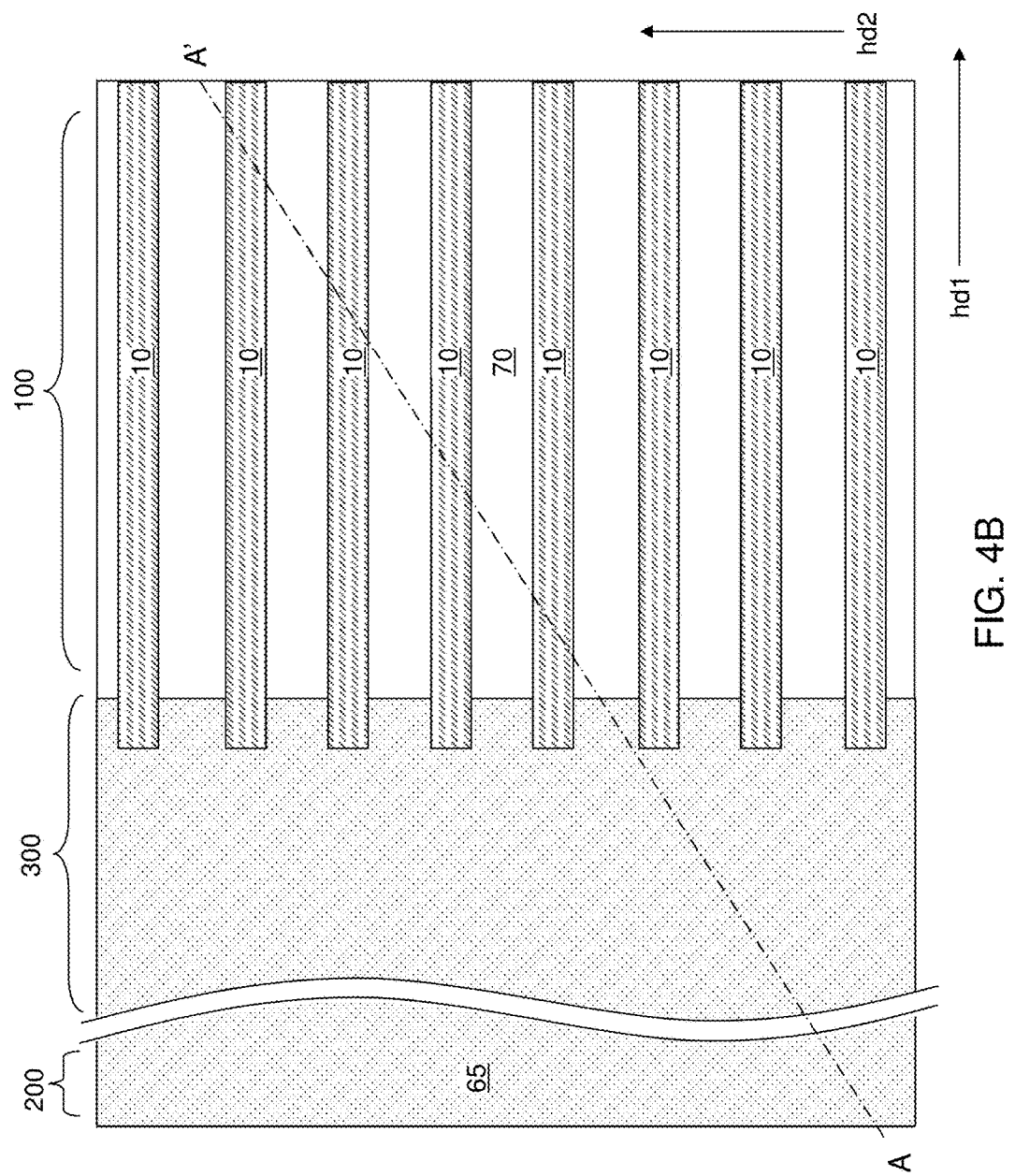
FIG. 4B is a top-down view of the exemplary structure of FIG. 4A. The vertical plane A-A' is the plane of the cross-section for FIG. 4A.

Referring to FIG. 3, the vertically alternating sequence of the insulating layers 32 and the spacer material layers (i.e., the sacrificial material layers 42) can be patterned to form stepped surfaces that continuously extend from a bottommost layer of the vertically alternating sequence (32, 42) to a topmost layer of the alternating sequence (32, 42) in the contact region 300. A stepped cavity can be formed within the contact region 300 which is located between the memory array region 100 and the peripheral device region 200 containing the at least one semiconductor device for the peripheral circuitry. The stepped cavity can have various stepped surfaces such that the horizontal cross-sectional shape of the stepped cavity changes in steps as a function of the vertical distance from the top surface of the substrate (9, 10). In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

Stepped surfaces are formed at a peripheral portion of the vertically alternating sequence (32, 42) through formation of the stepped cavity. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A "stepped cavity" refers to a cavity having stepped surfaces.

A terrace region is formed by patterning the vertically alternating sequence (32, 42). Each sacrificial material layer 42 other than a topmost sacrificial material layer 42 within the vertically alternating sequence (32, 42) laterally extends farther than any overlying sacrificial material layer 42 within the vertically alternating sequence (32, 42). The terrace region includes stepped surfaces of the vertically alternating sequence (32, 42) that continuously extend from a bottommost layer within the vertically alternating sequence (32, 42) to a topmost layer within the vertically alternating sequence (32, 42).

A retro-stepped dielectric material portion 65 (i.e., an insulating fill material portion) can be formed in the stepped cavity by deposition of a dielectric material therein. For example, a dielectric material such as silicon oxide can be deposited in the stepped cavity. Excess portions of the deposited dielectric material can be removed from above the top surface of the insulating cap layer 70, for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion 65, the silicon oxide of the retro-stepped dielectric material portion 65 may, or may not, be doped with dopants such as B, P, and/or F.

Referring to FIGS. 4A, 4B, 5A, and 5B, a lithographic material stack (not shown) including at least a photoresist layer can be formed over the insulating cap layer 70 and the retro-stepped dielectric material portion 65, and can be lithographically patterned to form line-shaped openings therein. The line-shaped openings laterally extend along a first horizontal direction hd1, and have a uniform width along a second horizontal direction hd2 that is perpendicular to the first horizontal direction hd1. The pattern in the lithographic material stack can be transferred through the insulating cap layer 70 or the retro-stepped dielectric material portion 65, and through the vertically alternating sequence (32, 42) by at least one anisotropic etch that employs the patterned lithographic material stack as an etch mask. Portions of the vertically alternating sequence (32, 42) underlying the line-shaped openings in the patterned lithographic material stack are etched to form line trenches 49. As used herein, a "line trench" refers to a trench that has laterally extends straight along a horizontal direction.

The line trenches 49 laterally extend along the first horizontal direction hd1 through the vertically alternating sequence (32, 42). In one embodiment, the line trenches 49 have a respective uniform width that is invariant under translation along the first horizontal direction hd1. In one embodiment, the line trenches 49 can have the same width throughout, and the spacing between neighboring pairs of the line trenches 49 can be the same. In this case, the line trenches 49 can constitute a one-dimensional periodic array of line trenches 49 having a pitch along a second horizontal direction hd2 that is perpendicular to the first horizontal direction hd1. The width of the line trenches 49 along the second horizontal direction hd2 can be in a range from 30 nm to 500 nm, such as from 60 nm to 250 nm, although lesser and greater widths can also be employed.

The line trenches 49 extend through each layer of the vertically alternating sequence (32, 42) and the retro-stepped dielectric material portion 65. The chemistry of the anisotropic etch process employed to etch through the materials of the vertically alternating sequence (32, 42) can alternate to optimize etching of the first and second materials in the vertically alternating sequence (32, 42). The anisotropic etch can be, for example, a series of reactive ion etches. The sidewalls of the line trenches 49 can be substantially vertical, or can be tapered. The patterned lithographic material stack can be subsequently removed, for example, by ashing.

The line trenches 49 laterally extend through the entire memory array region 100, and laterally extend into the contact region 300. The line trenches 49 may laterally extend through the entire contact region 300 along the first horizontal direction hd1, or may laterally extend only through part of a width, but not the entire width along the first horizontal direction hd1, of the contact region 300. In one embodiment, an overetch into the semiconductor material layer 10 may be optionally performed after the top surface of the semiconductor material layer 10 is physically exposed at a bottom of each line trench 49. The overetch may be performed prior to, or after, removal of the lithographic material stack. In other words, the recessed surfaces of the semiconductor material layer 10 may be vertically offset from the un-recessed top surfaces of the semiconductor material layer 10 by a recess depth. The recess depth can be, for example, in a range from 1 nm to 50 nm, although lesser and greater recess depths can also be employed. The overetch is optional, and may be omitted. If the overetch is not performed, the bottom surfaces of the line trenches 49 can be coplanar with the topmost surface of the semiconductor material layer 10.

Each of the line trenches 49 may include a sidewall (or a plurality of sidewalls) that extends substantially perpendicular to the topmost surface of the substrate. The substrate semiconductor layer 9 and the semiconductor material layer 10 collectively constitute a substrate (9, 10), which can be a semiconductor substrate. Alternatively, the semiconductor material layer 10 may be omitted, and the line trenches 49 can be extend to a top surface of the substrate semiconductor layer 9.

Referring to FIGS. 6A and 6B, an isotropic etch process is performed to etch the material of the sacrificial material strips 42 selective to the materials of the insulating strips 32 and the semiconductor material layer 10. The sacrificial material strips 42 are laterally recessed selective to the insulating strips during the isotropic etch process to form recessed concave sidewalls on the sacrificial material strips 42.

The concavity of the recessed sidewalls of the sacrificial material strips 42 is caused by geometry of the lateral recesses and limited supply of etchants in the isotropic etch process. After sidewalls of the sacrificial material strips 42 are laterally recessed relative to the sidewalls of the insulating strips 32, portions of the sidewalls of the sacrificial material strips 42 that are proximal to an overlying insulating strip 32 or an underlying insulating strip 32 are etched by a lesser influx of etchant molecules in the fluid (which may be a liquid or a gas) etchant than center portions of the sidewalls of the sacrificial material strips that are midway between the overlying insulating strip 32 and the underlying insulating strip 32. For example, the angle of incidence for etchant molecules within a vertical cross-sectional plane perpendicular to the lengthwise direction of the line trenches 49 can be about 90 degrees for portions of the sidewalls of the sacrificial material strips 42 adjoining an overlying or underlying insulating strip 32, but can be about 180 degrees for the portion of the sidewalls of the sacrificial material layers 42 that are approximately equidistance from the overlying insulating strip 32 and from the underlying insulating strip 32. Thus, middle portions of the sacrificial material strips 42 are laterally recessed more than upper portions and lower portions of the sacrificial material strips 42 to provide the concavity in the recessed sidewalls of the sacrificial material layers 42.

In one embodiment, the insulating strips 32 can include silicon oxide, and the sacrificial material strips 42 can include silicon nitride. In this case, the sacrificial material strips 42 can be laterally recessed by a wet etch process employing hot phosphoric acid. The sidewalls of the line trenches 49 develop a vertically undulating profile, i.e., a profile that have a lateral undulation while propagating along the vertical direction. Thus, the line trenches 49 are laterally selectively expanded at the levels of the sacrificial material strips 42 and are herein referred to as vertically undulating trenches 49'. Each of the vertically undulating trenches 49' has a vertical cross-sectional profile within vertical planes that are perpendicular to the first horizontal direction (e.g., word line direction) hd1 that is invariant with translation along the lengthwise direction of the vertically alternating sequence (32, 42). In other words, the line trenches 49 become vertically undulating trenches 49' having vertically undulating widths within vertical planes perpendicular to the first horizontal direction hd1.

In one embodiment, the maximum lateral recess distance mlrd for the recessed sidewalls of the sacrificial material layers 42 can be at least one half of the vertical thickness of the sacrificial material layers 42. In one embodiment, the maximum lateral recess distance mlrd for the recessed sidewalls of the sacrificial material layers 42 can be the same as, or greater than, the vertical thickness of the sacrificial material layers 42. Generally, the greater the ratio of the maximum lateral recess distance mlrd for the recessed sidewalls of the sacrificial material layers 42 to the thickness of the sacrificial material layers 42, the greater the curvature (and the concavity) of the recessed sidewalls of the sacrificial material layers 42.

Referring to FIGS. 7A and 7B, a continuous blocking dielectric material layer 52L, a continuous charge storage material layer 54L, and a continuous tunneling dielectric material layer 56L are sequentially formed in the vertically undulating trenches 49' and over the insulating cap layer 70.

The continuous blocking dielectric material layer 52L is formed directly on sidewalls and bottom surfaces of the vertically undulating trenches 49' by a conformal deposition process. The continuous blocking dielectric material layer 52L can include a single dielectric material layer or a stack of a plurality of dielectric material layers. In one embodiment, the blocking dielectric layer can include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the continuous blocking dielectric material layer 52L can include a dielectric metal oxide having a dielectric constant greater than 7.9, i.e., having a dielectric constant greater than the dielectric constant of silicon nitride.

Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof. The dielectric metal oxide layer can be deposited, for example, by chemical vapor deposition (CVD), atomic layer deposition (ALD), pulsed laser deposition (PLD), liquid source misted chemical deposition, or a combination thereof. The thickness of the dielectric metal oxide layer can be in a range from 1 nm to 20 nm, although lesser and greater thicknesses can also be employed. The dielectric metal oxide layer can subsequently function as a dielectric material portion that blocks leakage of stored electrical charges to the semiconductor channels. In one embodiment, the continuous blocking dielectric material layer 52L includes hafnium oxide or aluminum oxide. In one embodiment, the continuous blocking dielectric material layer 52L can include multiple dielectric metal oxide layers having different material compositions.

Alternatively or additionally, the continuous blocking dielectric material layer 52L can include a dielectric semiconductor compound such as silicon oxide, silicon oxynitride, silicon nitride, or a combination thereof. In one embodiment, the continuous blocking dielectric material layer 52L can include silicon oxide or a combination of silicon oxide and hafnium oxide. In this case, the dielectric semiconductor compound of the continuous blocking dielectric material layer 52L can be formed by a conformal deposition method such as low pressure chemical vapor deposition, atomic layer deposition, or a combination thereof. The thickness of the dielectric semiconductor compound can be in a range from 1 nm to 20 nm, although lesser and greater thicknesses can also be employed.

Subsequently, the continuous charge storage material layer 54L can be formed. In one embodiment, the continuous charge storage material layer 54L can be a dielectric charge trapping material, which can be, for example, silicon nitride. The continuous charge storage material layer 54L can be formed, for example, by chemical vapor deposition (CVD), atomic layer deposition (ALD), physical vapor deposition (PVD), or any suitable deposition technique for storing electrical charges therein. The thickness of the continuous charge storage material layer 54L can be in a range from 2 nm to 20 nm, although lesser and greater thicknesses can also be employed.

The continuous tunneling dielectric material layer 56L includes a dielectric material through which charge tunneling can be performed under suitable electrical bias conditions. The charge tunneling may be performed by Fowler-Nordheim tunneling. The continuous tunneling dielectric material layer 56L can include silicon oxide, silicon nitride, silicon oxynitride, dielectric metal oxides (such as aluminum oxide or hafnium oxide), dielectric metal oxynitride, dielectric metal silicates, alloys thereof, and/or combinations thereof. In one embodiment, the continuous tunneling dielectric material layer 56L can include a stack of a first silicon oxide layer, a silicon oxynitride layer, and a second silicon oxide layer, which is commonly known as an ONO stack. In one embodiment, the continuous tunneling dielectric material layer 56L can include a silicon oxide layer that is substantially free of carbon or a silicon oxynitride layer that is substantially free of carbon. The thickness of the continuous tunneling dielectric material layer 56L can be in a range from 2 nm to 20 nm, although lesser and greater thicknesses can also be employed.

The stack of the continuous blocking dielectric layer 52L, the continuous charge storage layer 54L, and the continuous tunneling dielectric layer 56L constitutes a continuous memory film layer 50L that continuously extends over the vertically undulating trenches 49' and the insulating cap layer 70. In an alternative embodiment, the locations of the blocking dielectric layer 52L and the continuous tunneling dielectric layer 56L can be switched to form an inverse device having a blocking dielectric adjacent to the channel and a tunneling dielectric layer adjacent to the word lines/control gate electrodes. An inverse flat cell memory device is described in U.S. patent application Ser. No. 15/971,525 filed on May 4, 2018, which is incorporated herein by reference in its entirety.

Subsequently, a continuous cover material layer 601L can be optionally formed on the continuous memory film layer 50L. The continuous cover material layer 601L can include a semiconductor material (such as amorphous silicon or polysilicon) that can be subsequently incorporated into vertical semiconductor channels, or can include a sacrificial material (such as amorphous carbon) that is subsequently removed. The continuous cover material layer 601L covers and protects the underlying continuous memory film layer 50L during a subsequent anisotropic etch process to prevent etch damages to the continuous memory film layer 50L. The thickness of the continuous cover material layer 601L can be in a range from 1 nm to 10 nm, although lesser and greater thicknesses can also be employed.

Referring to FIGS. 8A and 8B, horizontal portions of the continuous cover material layer 601L and the continuous memory film layer 50L can be removed by at least one anisotropic etch process from above the top surface of the insulating cap layer 70 and from bottom portions of the vertically undulating cavities 49'. Each remaining portion of the continuous cover material layer 601L constitutes a cover material layer 601R. The continuous memory film layer 50L is divided into memory film layers 50R by the at least one anisotropic etch process. Each remaining portion of the continuous tunneling dielectric material layer 56L constitutes a tunneling dielectric material layer 56R. Each remaining portion of the continuous charge storage material layer 54L constitutes a charge storage material layer 54R. Each remaining portion of the continuous blocking dielectric material layer 52L constitutes a blocking dielectric material layer 52R.

Each of the blocking dielectric layers 52R, the charge storage material layers 54R, and the tunneling dielectric material layers 56R can include a pair of lengthwise sidewalls that laterally extend along the first horizontal direction hd1 and a pair of widthwise sidewalls that laterally extend along the second horizontal direction hd2. Each contiguous set of a blocking dielectric layer 52R, a charge storage material layer 54R, and a tunneling dielectric material layer 56R constitutes a memory film layer 50R. A top surface of the semiconductor material layer 10 can be physically exposed at the bottom of each vertically undulating trench 49'. In case the continuous cover material layer 601L includes a sacrificial material such as amorphous carbon, remaining portions of the cover material layers 601R can be removed, for example, by ashing.

Referring to FIGS. 9A and 9B, a continuous semiconductor channel material layer 602L can be deposited directly on the semiconductor surfaces of the semiconductor material layer 10, and directly on the cover material layers 601R (if present) or directly on the tunneling dielectric material layers 56R if the cover material layers 601R are not present. The continuous semiconductor channel material layer 602L can directly contact physically exposed top surfaces of the semiconductor material layer 10. The continuous semiconductor channel material layer 602L includes a semiconductor material such as at least one elemental semiconductor material, at least one III-V compound semiconductor material, at least one II-VI compound semiconductor material, at least one organic semiconductor material, or other semiconductor materials known in the art. In one embodiment, the continuous semiconductor channel material layer 602L includes amorphous silicon or polysilicon. The continuous semiconductor channel material layer 602L can be formed by a conformal deposition method such as low pressure chemical vapor deposition (LPCVD). The thickness of the continuous semiconductor channel material layer 602L can be in a range from 2 nm to 10 nm, although lesser and greater thicknesses can also be employed. In one embodiment, the continuous semiconductor channel material layer 602L can have a doping of the first conductivity type, which is the same conductivity type as the conductivity type of the doping of the semiconductor material layer 10. In one embodiment, the continuous semiconductor channel material layer 602L can comprise a semiconducting material including electrical dopants at an atomic concentration in a range from $1.0\times10^{14}/cm^3$ to $1.0\times10^{18}/cm^3$.

A dielectric fill material such as silicate glass can be deposited in remaining volumes of the vertically undulating cavities 49' by a conformal deposition process (such as low pressure chemical vapor deposition) or a self-planarizing deposition process (such as spin coating). The dielectric fill material fills the remaining volumes of the vertically undulating cavities 49' and is deposited over horizontal portions of the continuous semiconductor channel material layer 602L that overlie the insulating cap layer 70.

Referring to FIGS. 10A and 10B, the dielectric fill material can be vertically recessed, for example, by a recess etch. Portions of the dielectric fill material overlying the horizontal portions of the continuous semiconductor channel material layer 602L that overlie the insulating cap layer 70 are removed by the recess etch. The dielectric fill material is further vertically recessed selective to the material of the continuous semiconductor channel material layer 602L such that remaining portions of the dielectric fill material has a top surface between the horizontal plane including the top surface of the insulating cap layer 70 and the horizontal plane including the bottom surface of the insulating cap layer 70. Each remaining portion of the dielectric fill material constitutes a dielectric rail 62R. As used herein, a "rail" or a "rail structure" refers to an elongated structure that laterally extends along a horizontal direction (which is a "lengthwise" direction).

Subsequently, horizontal portions of the continuous semiconductor channel material layer 602L that overlie the vertically alternating sequence (32, 42) (which are remaining portions of the vertically alternating sequence) can be removed by another recess etch process. Remaining portions of the continuous semiconductor channel material layer 602L comprise semiconductor channel material rails 602R. In case the cover material layers 601R are present, each contiguous set of a pair of cover material layers 601R and a semiconductor channel material rail 602R constitutes a semiconductor channel material rail 60R.

Referring to FIGS. 11A and 11B, a doped semiconductor material having a doping of a second conductivity type is formed in voids that overlie the dielectric rails 62R. The second conductivity type is the opposite of the first conductivity type. The doped semiconductor material can include electrical dopants of the second conductivity type at an atomic concentration in a range from $5.0\times10^{19}/cm^3$ to $1.0\times10^{21}/cm^3$. Portions of the deposited doped semiconductor material of the second conductivity type that overlie the horizontal plane including the top surface of the insulating cap layer 70 can be removed by a planarization process, which can be a recess etch that etches the semiconductor materials selective to the dielectric material of the insulating cap layer 70 or a chemical mechanical planarization (CMP) process. Each remaining portion of the doped semiconductor material of the second conductivity type constitutes a drain region rail 63R, which is subsequently divided into a plurality of drain regions.

The set of all material portions filling a vertically undulating trench 49' constitutes a trench fill structure 58R. Each trench fill structure 58R can include a pair of tunneling dielectric material layers 56R, a pair of charge storage material layers 54R, a pair of blocking dielectric material layers 52R, a semiconductor channel material rail 60R, a dielectric core rail 62R, and a drain region rail 63R.

Each semiconductor channel material rail 60R can be formed with a U-shaped vertical cross-sectional profile. In one embodiment, each semiconductor channel material rail 60R can include a pair of vertically extending wing portions that laterally extend along the first horizontal direction hd1 and a horizontal connecting portion that is adjoined to bottom regions of the pair of vertically extending wing portions. A stack of a dielectric core rail 62R and a drain region rail 63R can be formed within each semiconductor channel material rail 60R. Each drain region rail 63R contacts a top portion of a semiconductor channel material rail 60R within a respective trench fill structure 58R. Each dielectric core rail 62R contacts inner sidewalls of a respective semiconductor channel material rail 60R and underlies a respective drain region rail 63R.

Referring to FIGS. 12A-12D, a photoresist layer (not shown) can be applied over the exemplary structure, and can be lithographically patterned to form rows of openings that overlie the trench fill structures 58R. Further, elongated openings can be formed in the portion of the photoresist layer located in the contact region 300. The elongated openings overlie portions of the trench fill structures 58R in the contact region 300 and/or are formed in areas corresponding to extensions of the trench fill structures 58R into the contact region 300 along the first horizontal direction hd1.

An anisotropic etch is performed employing the patterned photoresist layer as an etch mask. Unmasked portions of the trench fill structures 58R, the vertically alternating sequence (32, 42), and the retro-stepped dielectric material portion 65 are etched through by the anisotropic etch process. The anisotropic etch process can be a reactive ion etch process that indiscriminately etches the materials of the trench fill structures 58R, the vertically alternating sequence (32, 42), and the retro-stepped dielectric material portion 65. End point detection can be effected by sensing of physical exposure of the surfaces of the semiconductor material layer 10.

Discrete isolation cavities 69 (also referred to as "pillar cavities") are formed in rows that overlap with the areas of the trench fill structures 58R. The discrete isolation cavities 69 can have substantially vertical sidewalls, and laterally divide each trench fill structure 58R into memory stack assemblies 58. In one embodiment, the discrete isolation cavities 69 can be formed as a two-dimensional array of isolation cavities 69 extending through the trench fill structures 58R. Each of the isolation cavities 69 extends to the substrate (9, 10), and sidewalls of remaining portions of the insulating layers 32 and the spacer material layers (i.e., the sacrificial material layers 42) are physically exposed around the isolation cavities 69. The vertically undulating trenches 49' can be modified by the isolation cavities 69 and the elongated isolation cavities 169. The widths of the isolation cavities 69 and the elongated isolation cavities 169 can be greater than the maximum width of the vertically undulating trenches 49' to ensure that each component within a trench fill structure 58R is laterally divided by the isolation cavities 69 and the elongated isolation cavities 169. Sidewalls of the insulating layers 32 within the vertically alternating sequence (32, 42) that generally extend along the first horizontal direction hd1 can have a lateral undulation along the second horizontal direction hd2. Further, sidewalls of the sacrificial material layers 42 within the vertically alternating sequence (32, 42) can have a lesser lateral undulation than the lateral undulation of an overlying insulating layer 32 or an underlying insulating layer 32 along the second horizontal direction hd2.

Each memory stack assembly 58 is a patterned portion of a trench fill structure 58R. Each memory stack assembly 58 includes a pair of tunneling dielectrics 56 that are patterned portions of a pair of tunneling dielectric material layers 56R, a pair of charge storage layers 54 that are patterned portions of a pair of charge storage material layers 54R, and a pair of blocking dielectrics 52 that are patterned portions of a pair of blocking dielectric material layers 52R. Each contiguous set of a tunneling dielectric 56, a charge storage layer 54, and a blocking dielectric 52 constitutes a memory film 50.

In case a pair of cover material layers 601R is present within each semiconductor channel material rail 60R, each remaining portion of the cover material layers 601R constitutes an outer semiconductor channel portion 601. Each remaining portion of the semiconductor channel material rails 602R constitutes a semiconductor channel portion 602. In case outer semiconductor channel portions 601 are present, each contiguous set of a semiconductor channel portion 602 and a pair of outer semiconductor channel portions 602 constitutes a vertical semiconductor channel 60. In case outer semiconductor channel portions are not present, each semiconductor channel portion 602 constitutes a vertical semiconductor channel 60. Each memory stack assembly 58 includes a respective vertical semiconductor channel 60.

Each patterned portion of the drain region rails 63R constitutes a drain region 63. Each patterned portion of the dielectric core rails 62R constitute a dielectric core 62. Each memory stack assembly 58 includes a respective dielectric core 62 and a drain region 63.

Each memory stack assembly 58 includes a respective vertical semiconductor channel 60 and a respective memory film 50. In one embodiment, each memory film 50 can have a thickness that is less than one half of the minimum thickness of the sacrificial material layers 42 such that the vertical semiconductor channel 60 has vertically undulating sidewalls. In this case, each vertical semiconductor channel 60 can be formed with a laterally protruding portion at each level of the sacrificial material layers 42. A drain region 63 contacts a top portion of a vertical semiconductor channel 60 within a respective memory stack assembly 58. A dielectric core 62 contacts inner sidewalls of a respective vertical semiconductor channel 60, underlies a respective drain region 63, and includes a pair of sidewalls that are physically exposed to a pair of isolation cavities 69.

Elongated isolation cavities 69' can be formed in the contact region 300 such that the combination of the elongated isolation cavities 69', the memory stack assemblies 58, and the discrete isolation cavities 69 collectively divide the vertical alternating sequence (32, 42) of insulating layers 32 and sacrificial material layers 42 into multiple discrete portions that are laterally divided along the second horizontal direction hd2. Each patterned portion of the insulating layers 32 has a strip shape that has the first horizontal direction hd1 as a lengthwise direction and the second horizontal direction hd2 as a widthwise direction. Thus, each patterned portion of the insulating layers 32 is herein referred to as an insulating strip 32. Likewise, each patterned portion of the sacrificial material layers 42 has a strip shape that has the first horizontal direction hd1 as a lengthwise direction and the second horizontal direction hd2 as a widthwise direction. Thus, each patterned portion of the sacrificial material layers 42 is herein referred to as a sacrificial material strip 32.

Each set of vertically neighboring insulating strips 32 and sacrificial material strips 42 constitutes an alternating stack of the insulating strips 32 and the sacrificial material strips 42. Thus, each divided portion of the vertical alternating sequence (32, 42) of insulating layers 32 and sacrificial material layers 42 constitutes an alternating stack (32, 42) of insulating strips 32 and sacrificial material strips 42.

Figure 12A:
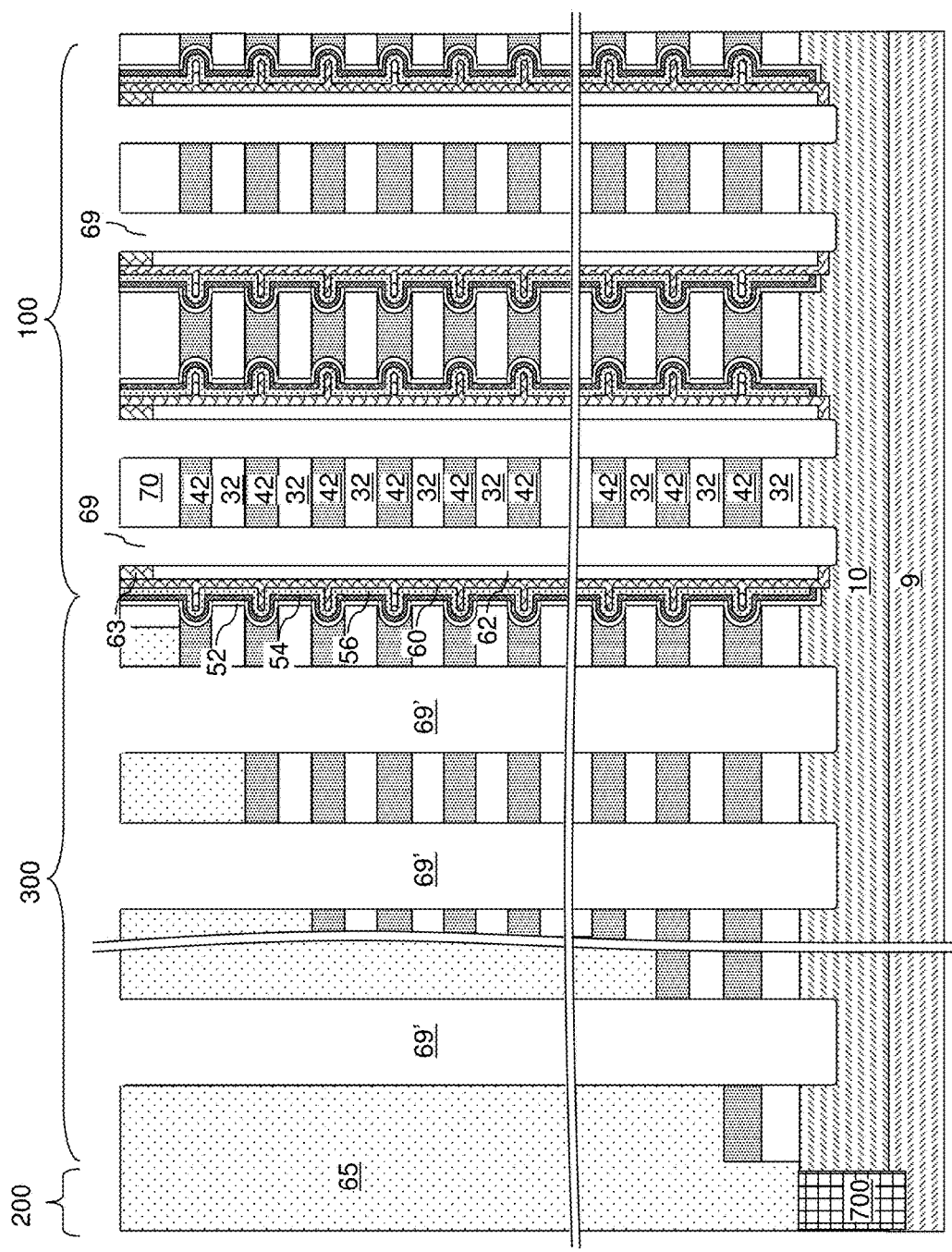
FIG. 12A is a vertical cross-sectional view of the exemplary structure after formation of isolation cavities through line trench fill structures according to an embodiment of the present disclosure.
Figure 12B:
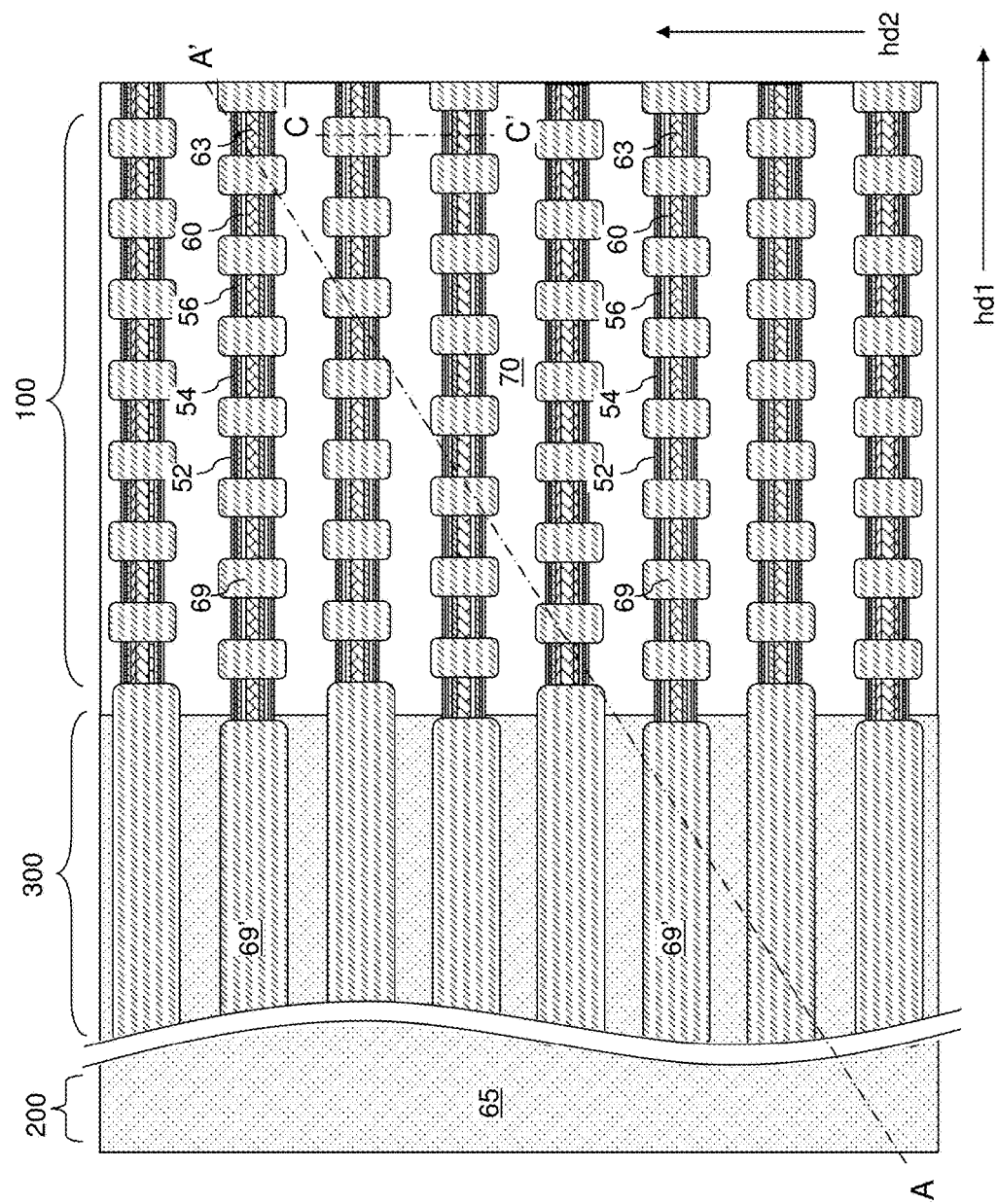
FIG. 12B is a top-down view of the exemplary structure of FIG. 12A. The vertical plane A-A' is the plane of the cross-section for FIG. 12A.
Figure 12C:
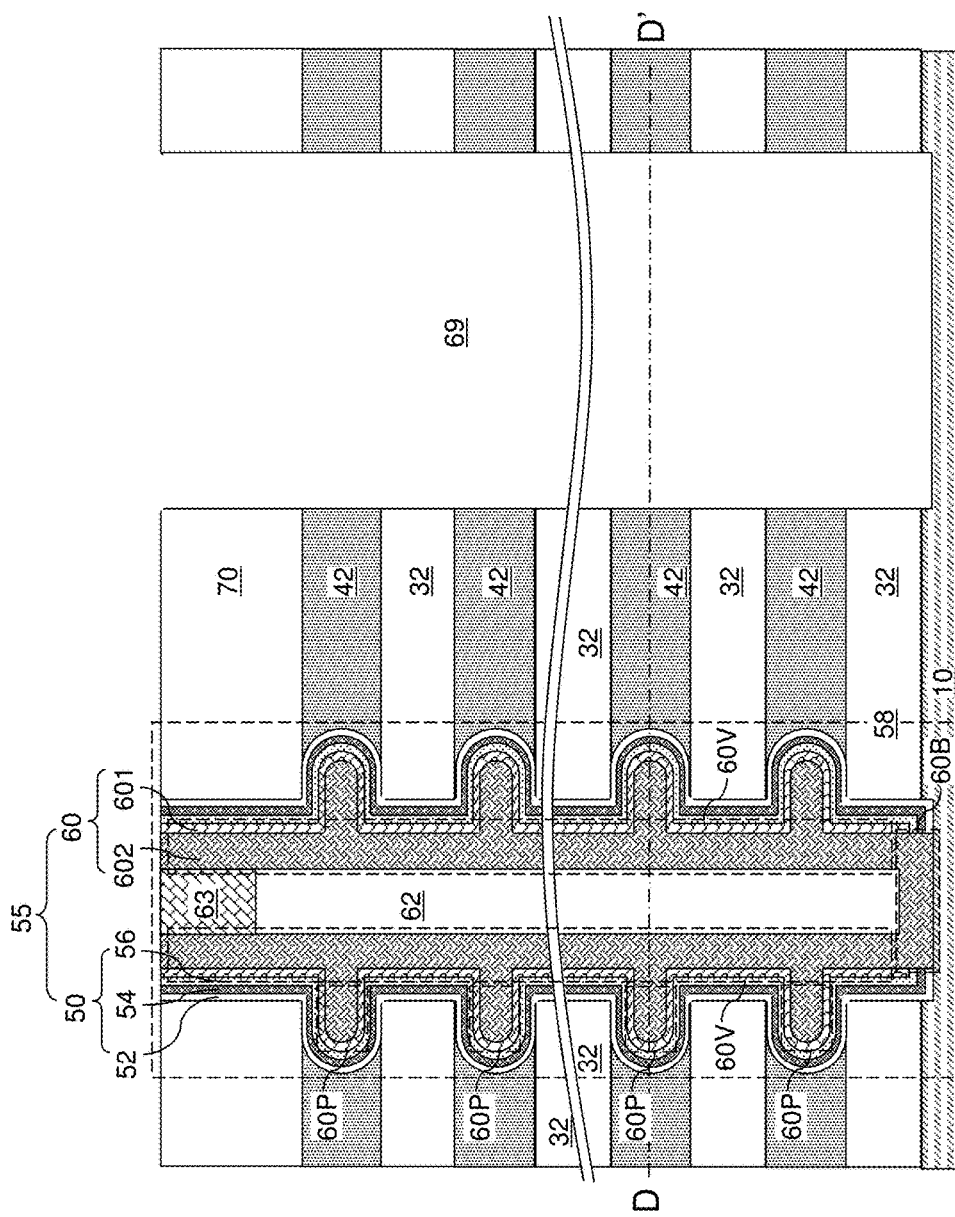
FIG. 12C is a vertical cross-sectional view of a region of the exemplary structure along the vertical plane C-C' of FIG. 12B.
Figure 12D:
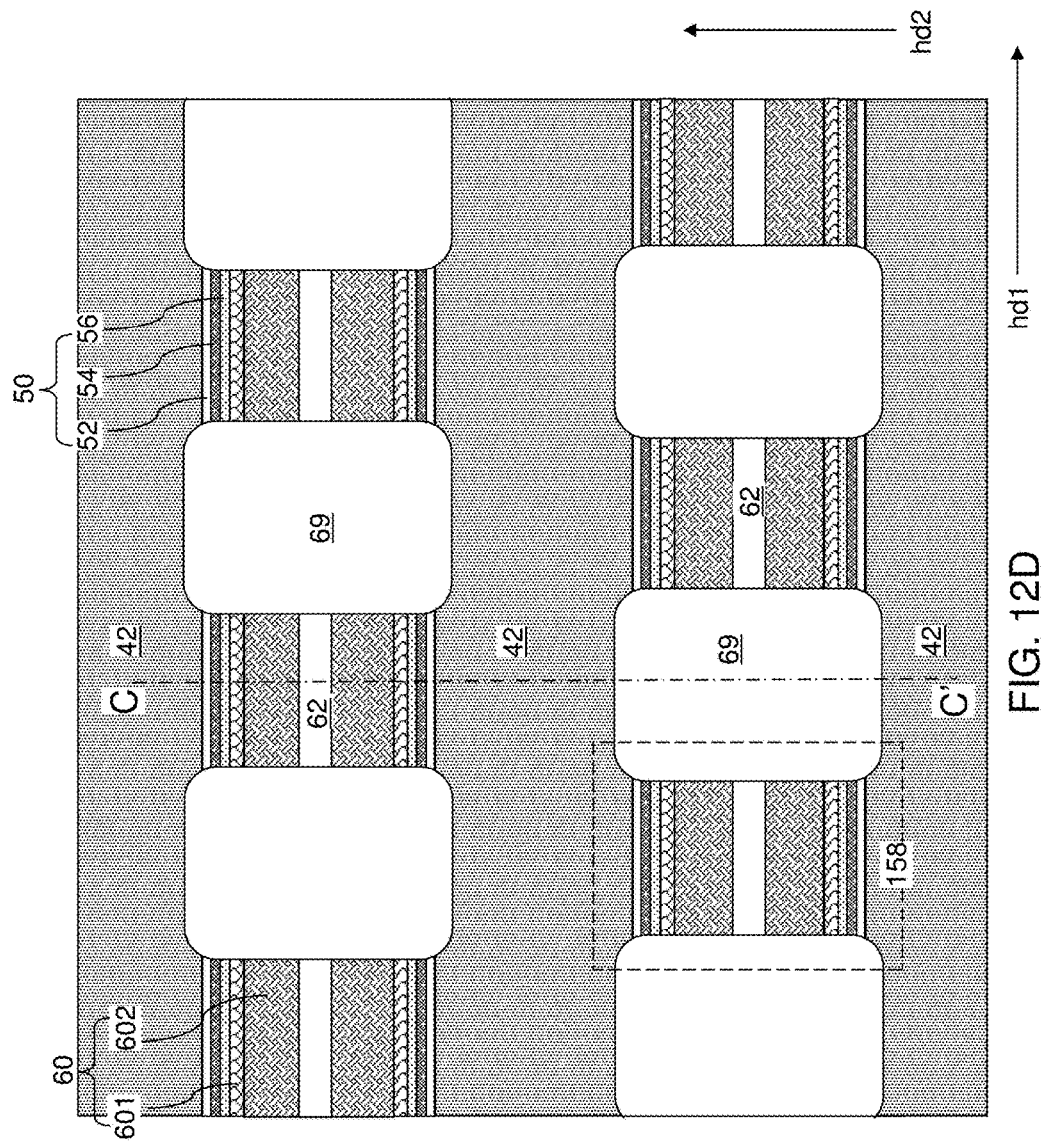
FIG. 12D is a horizontal cross-sectional view along the plane D-D' of FIG. 12C.
Figure 13B:
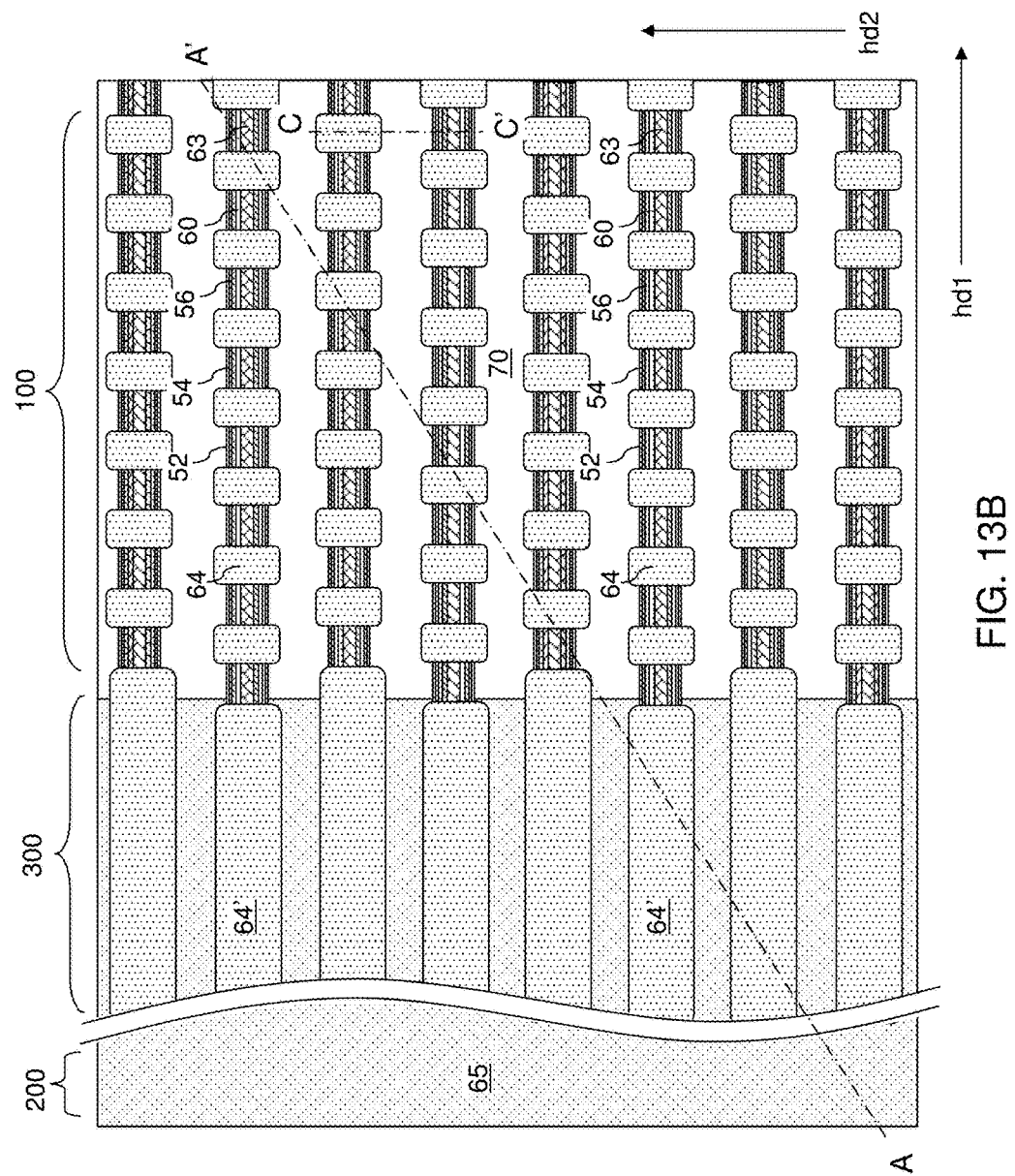
FIG. 13B is a top-down view of the exemplary structure of FIG. 13A. The vertical plane A-A' is the plane of the cross-section for FIG. 13A.
Figure 13C:
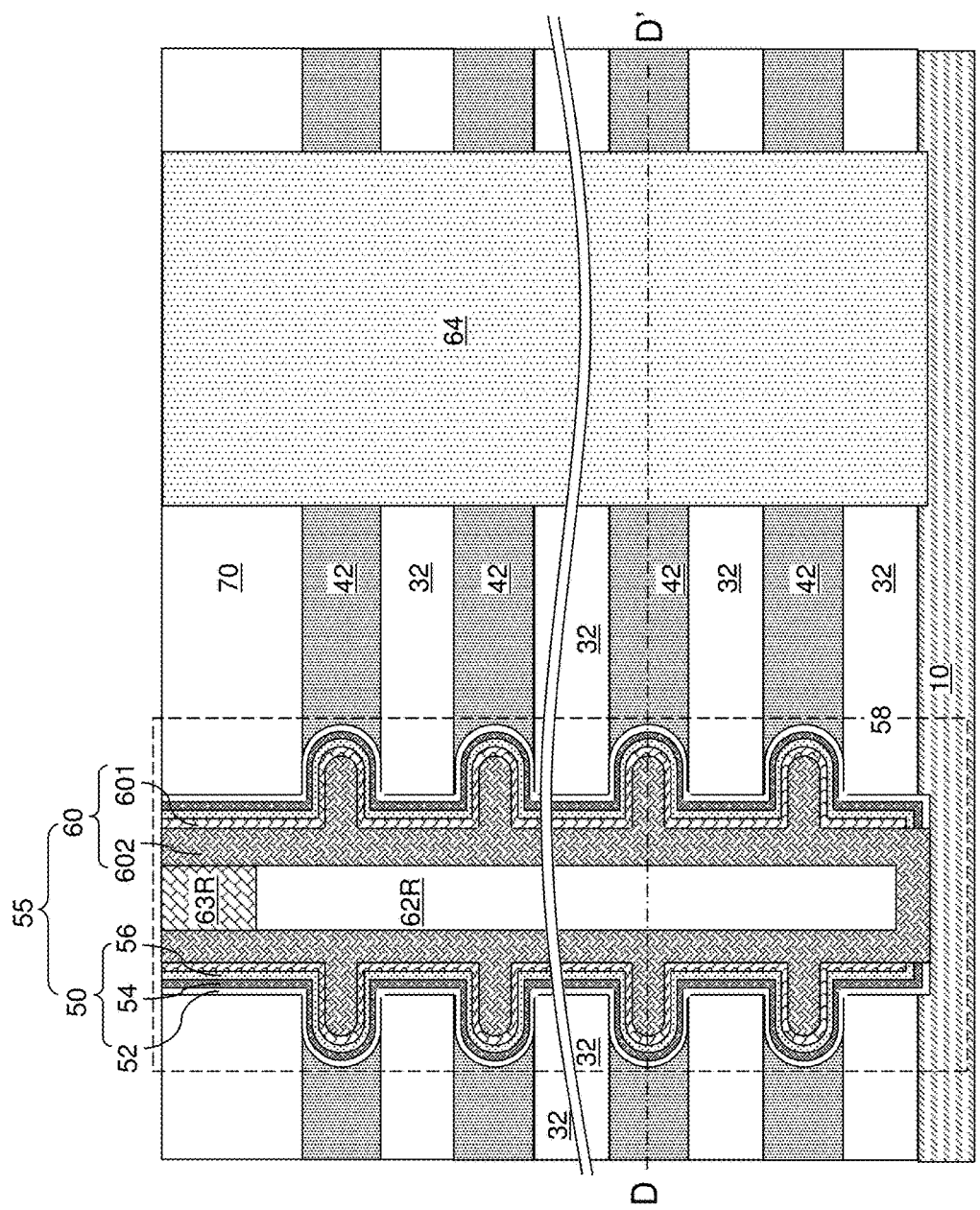
FIG. 13C is a vertical cross-sectional view of a region of the exemplary structure of FIG. 13A.
Figure 13D:
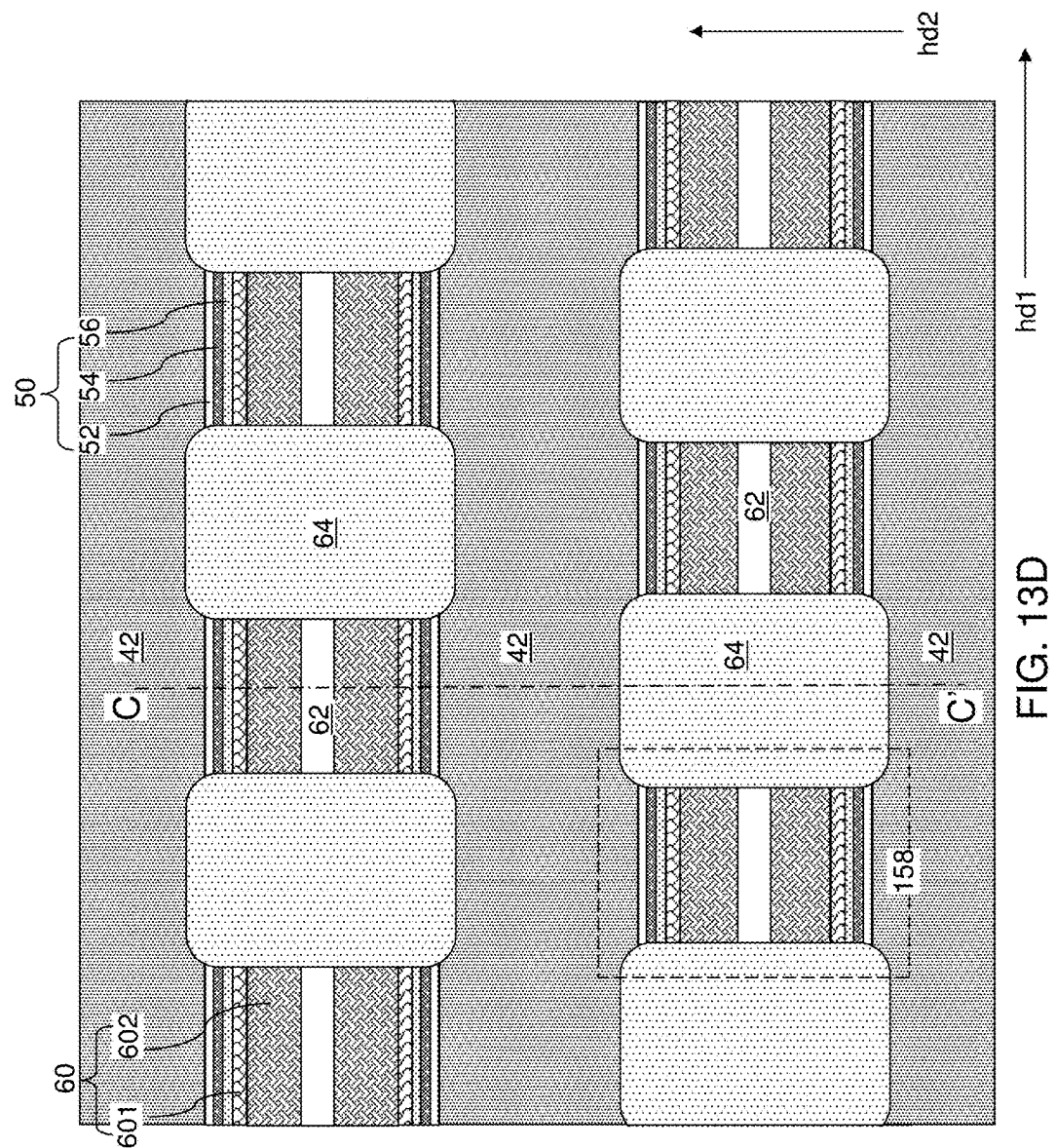
FIG. 13D is a horizontal cross-sectional view along the plane D-D' of FIG. 13C.

In one embodiment shown in FIG. 12C, the vertical semiconductor channel 60 comprises a pair of vertically-extending portions 60V, a bottom portion 60B that connects bottom ends of the pair of vertically-extending portions 60V, and laterally-protruding portions 60P located at each level of the sacrificial material strips 42 and extending away from the pair of vertically-extending portions 60V. In one embodiment, each of the laterally-protruding portions 60P includes a horizontal top surface contacting a horizontal bottom surface of the memory film 50, a horizontal bottom surface contacting a horizontal top surface of the memory film 50, and a convex sidewall adjoined to the horizontal top surface of the memory film 50 and to the horizontal bottom surface of the memory film 50.

Referring to FIGS. 13A-13D, a dielectric material such as a doped silicate glass, undoped silicate glass, or organosilicate glass can be deposited in the discrete isolation cavities 69 and the elongated isolation cavities 69' by a conformal deposition process or a non-conformal deposition process. For example, low pressure chemical vapor deposition (LP-CVD), sub-atmospheric chemical vapor deposition (SACVD), and/or plasma enhanced chemical vapor deposition (PECVD) can be employed to deposit the dielectric material that fills the discrete isolation cavities 69 and the elongated isolation cavities 69' at least partially, i.e., with, or without, voids therein. Excess portions of the deposited dielectric material can be removed from above the top surfaces of the insulating cap layer 70 and the retro-stepped dielectric material portion 65 by a planarization process, which can include chemical mechanical planarization (CMP) and/or a recess etch. Each remaining portion of the deposited dielectric material in the discrete isolation cavities 69 constitutes a dielectric pillar structure 64. Each remaining portion of the deposited dielectric material in the elongated isolation cavities 69' constitutes a dielectric wall structure 64'.

A two-dimensional array of dielectric pillar structures 64 can be formed in the discrete isolation cavities 69, which divide the trench fill structures 58R into memory stack assemblies 58. Generally, the two-dimensional array of dielectric pillar structures 64 can be formed by depositing a dielectric fill material in the isolation cavities 69 and by planarizing the dielectric fill material from above the topmost layer of the alternating sequences (32, 42), i.e., from above the topmost layers of remaining portions of the vertically alternating sequence (32, 42). If the insulating cap layer 70 is employed, the top surface of the insulating cap layer 70 can be employed as a planarization surface. Remaining portions of the dielectric fill material constitute the two-dimensional array of dielectric pillar structures 64.

Each dielectric pillar structure 64 can have a maximum dimension along the second horizontal direction hd2 that is at least the maximum width of the vertically undulating trench 49' through which the dielectric pillar structure 64 extends. In one embodiment, each dielectric pillar structure 64 can have a pair of first sidewalls that contact a pair of alternating stacks (32, 42) of insulating strips 32 and sacrificial material strips 42. In one embodiment, one or more of the dielectric pillar structures 64 can include a pair of second sidewalls that contact sidewalls of a pair of memory stack assemblies 58. In one embodiment, the first sidewalls and the second sidewalls can have vertical planar portions (i.e., portions contained within a respective two-dimensional Euclidean plane), and may include curved vertical portions that can be concave vertical portions.

An interlaced two-dimensional array of memory stack assemblies 58 and dielectric pillar structures 64 can be located in the vertically undulating trenches 49'. Each of the vertically undulating trenches 49' is filled with a respective laterally alternating sequence of memory stack assemblies 58 and dielectric pillar structures 64. A dielectric core 62 contacts inner sidewalls of a respective vertical semiconductor channel 60, underlies a respective drain region 63, and laterally contacts a respective pair of dielectric pillar structures 64. In one embodiment, each memory film 50 has a thickness that is less than one half of the minimum thickness of the sacrificial material layers 42. In one embodiment, each vertical semiconductor channel 60 is formed with a laterally protruding portion at each level of the sacrificial material layers 42.

Figure 14A:
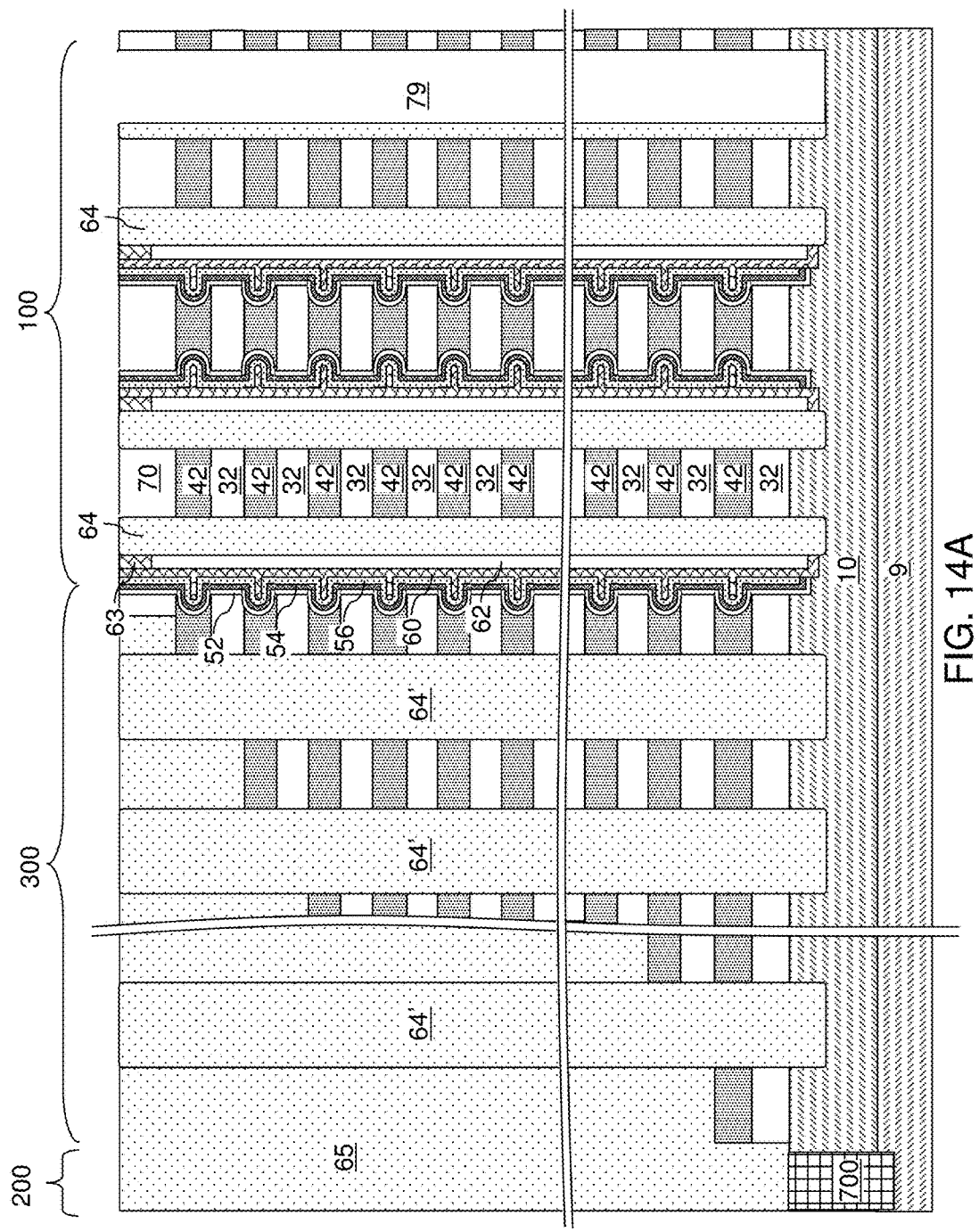
FIG. 14A is a vertical cross-sectional view of the exemplary structure after formation of backside via cavities according to an embodiment of the present disclosure.
Figure 14B:
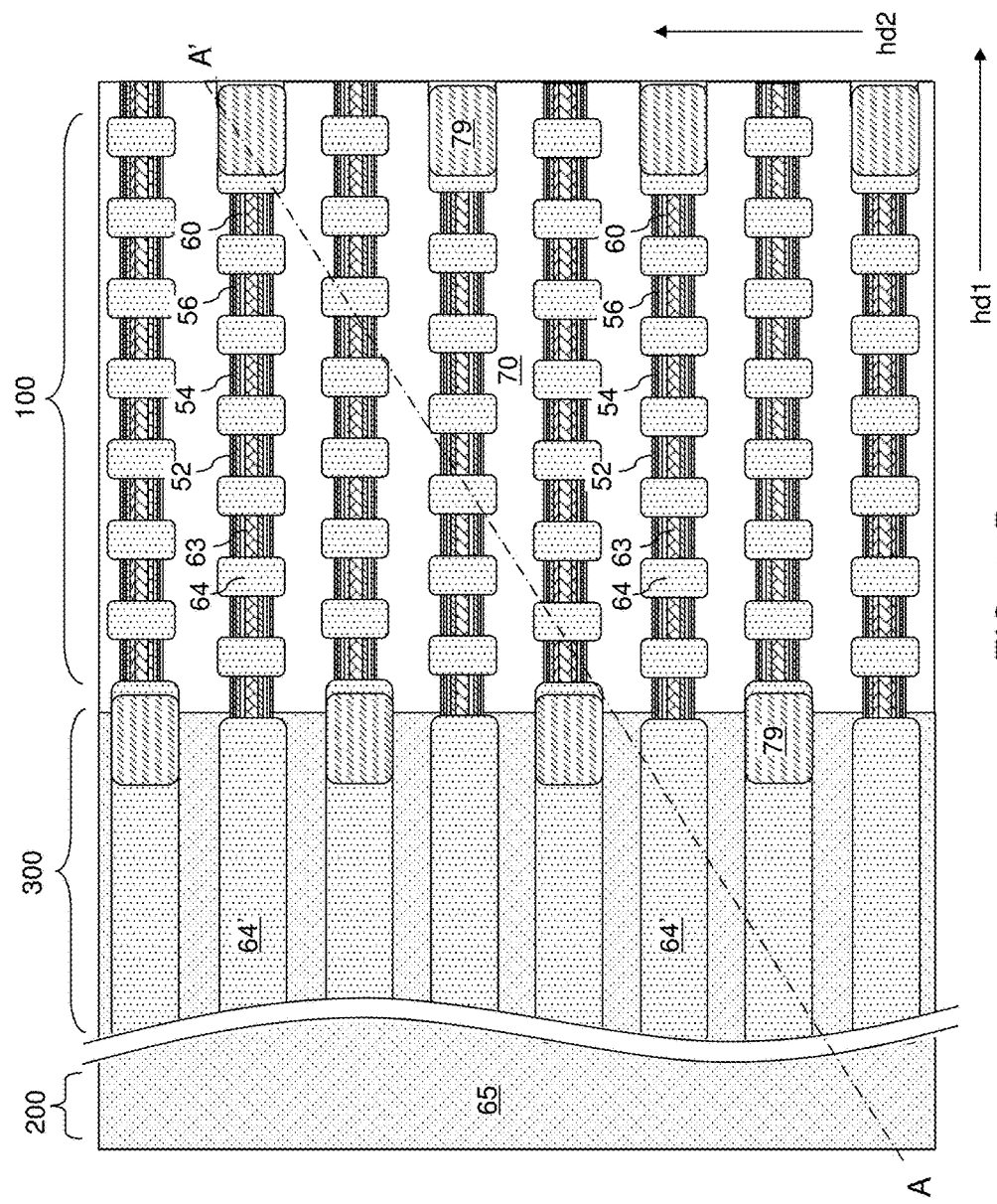
FIG. 14B is a top-down view of the exemplary structure of FIG. 14A. The vertical plane A-A' is the plane of the cross-section for FIG. 14A.

Referring to FIGS. 14A and 14B, backside via cavities 79 can be formed through a subset of the dielectric pillar structures 64 and portions of the dielectric wall structures 64'. The locations of the backside via cavities 79 can be selected such that each sacrificial material strip 42 contacts at least one of the backside via cavities 79. Further, the locations of the backside via cavities can be selected such that each point within the sacrificial material strip 42 is laterally spaced from a most proximal one of the sacrificial material strips 42 by a lateral distance that does not exceed a lateral etch distance during a subsequent etch process that etches the material of the sacrificial material strips 42 selective to the materials of the insulating strips 32 and the blocking dielectrics 52. In one embodiment, a subset of the backside via cavities 79 can have the same area as a respective one of the dielectric pillar structures 64. In this case, a backside via cavity 79 can be formed by removing a respective dielectric pillar structure 64. In another embodiment, the backside via cavities 79 can only partially overlap in area with a respective one of the dielectric pillar structures 64. In yet another embodiment, the backside via cavities 79 may overlap in area, at least partially, with two or more of the dielectric pillar structures 64 and with any intervening assemblies 58. In this case, the assembly 58 may be removed during formation of the backside via cavities 79. A subset of the backside via cavities 79 formed through the dielectric wall structures 64' may divide one or more of the dielectric wall structures 64' into multiple discrete portions.

Figure 15:
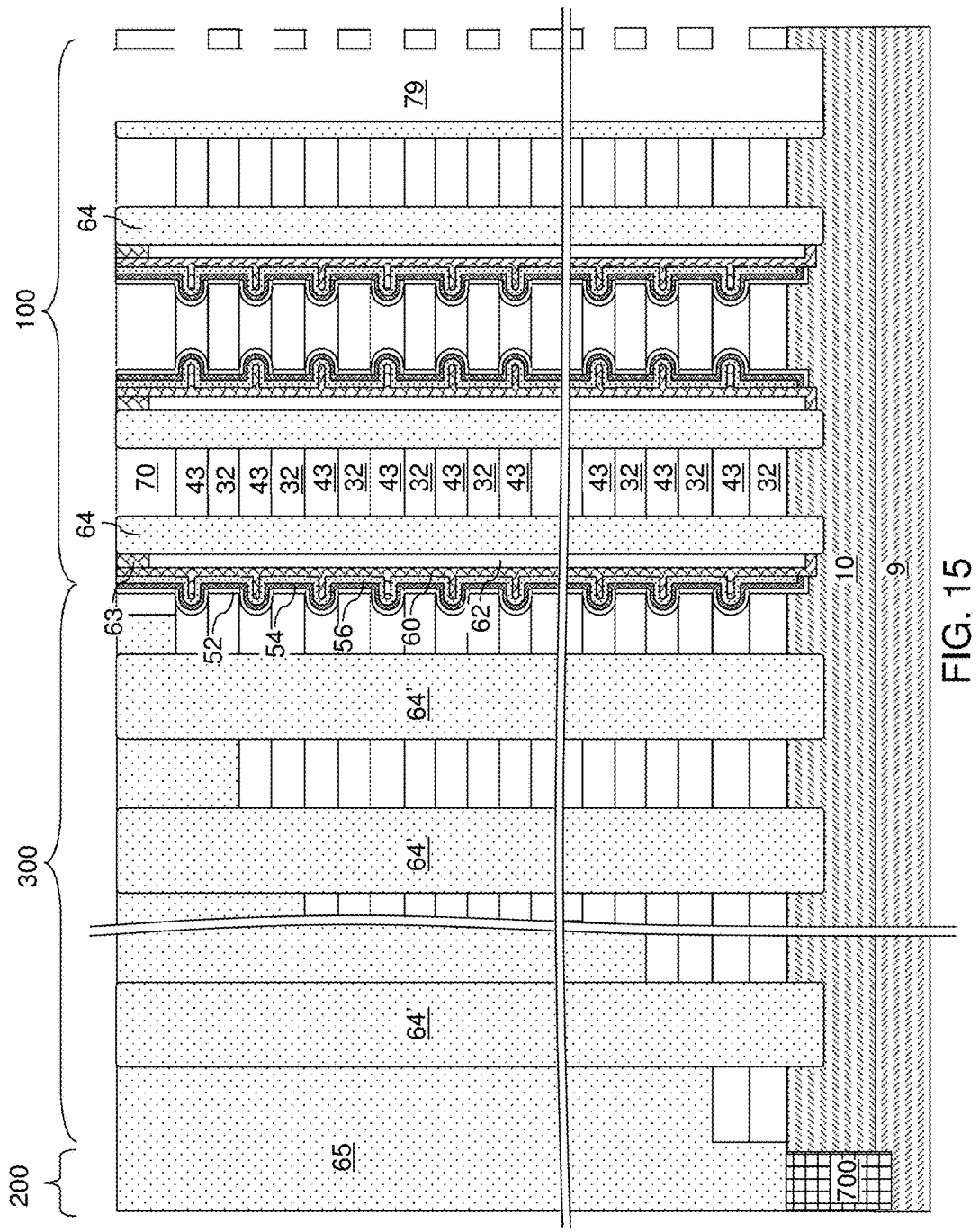
FIG. 15 is a schematic vertical cross-sectional view of the exemplary structure after formation of backside recesses according to an embodiment of the present disclosure.

Referring to FIG. 15, an etchant that selectively etches the second material of the sacrificial material strips 42 with respect to the first material of the insulating strips 32 can be introduced into the backside via cavities 79, for example, employing an isotropic etch process. Backside recesses 43 are formed in volumes from which the sacrificial material strips 42 are removed. The removal of the second material of the sacrificial material strips 42 can be selective to the first material of the insulating strips 32, the material of the retro-stepped dielectric material portion 65, the material of the dielectric pillar structures 64 and the dielectric wall structures 64', and the material of the outermost layer of the memory films 50, i.e., the material of the blocking dielectrics 52. In one embodiment, the sacrificial material strips 42 can include silicon nitride, and the materials of the insulating strips 32 and the retro-stepped dielectric material portion 65 can be silicon oxide materials such as undoped silicate glass and/or a doped silicate glass.

The isotropic etch process that removes the second material selective to the first material and the outermost layer of the memory films 50 can be a wet etch process employing a wet etch solution, or can be a gas phase (dry) etch process in which the etchant is introduced in a vapor phase into the backside via cavities 79. For example, if the sacrificial material strips 42 include silicon nitride, the etch process can be a wet etch process in which the exemplary structure is immersed within a wet etch tank including phosphoric acid, which etches silicon nitride selective to silicon oxide. The duration of the isotropic etch process can be selected such that the sacrificial material strips 42 are completely removed from each alternating stack (32, 42) of insulating strips 32 and sacrificial material strips 42. Each backside recess 43 can be a laterally extending cavity having a lateral dimension that is greater than the vertical extent of the cavity. In other words, the lateral dimension of each backside recess 43 can be greater than the height of the backside recess 43.

In one embodiment, the memory array region 100 comprises an array of monolithic three-dimensional NAND strings having a plurality of device levels disposed above the substrate (9, 10). In this case, each backside recess 43 can define a space for receiving a respective word line of the array of monolithic three-dimensional NAND strings. Each of the plurality of backside recesses 43 can extend substantially parallel to the top surface of the substrate (9, 10). A backside recess 43 can be vertically bounded by a top surface of an underlying insulating strip 32 and a bottom surface of an overlying insulating strip 32. In one embodiment, each backside recess 43 can have a uniform height throughout. The memory stack assemblies 58, the dielectric pillar structures 64, and the dielectric wall structures 64' provide structural support to the exemplary structure during formation of the backside recesses 43.

Figure 16A:
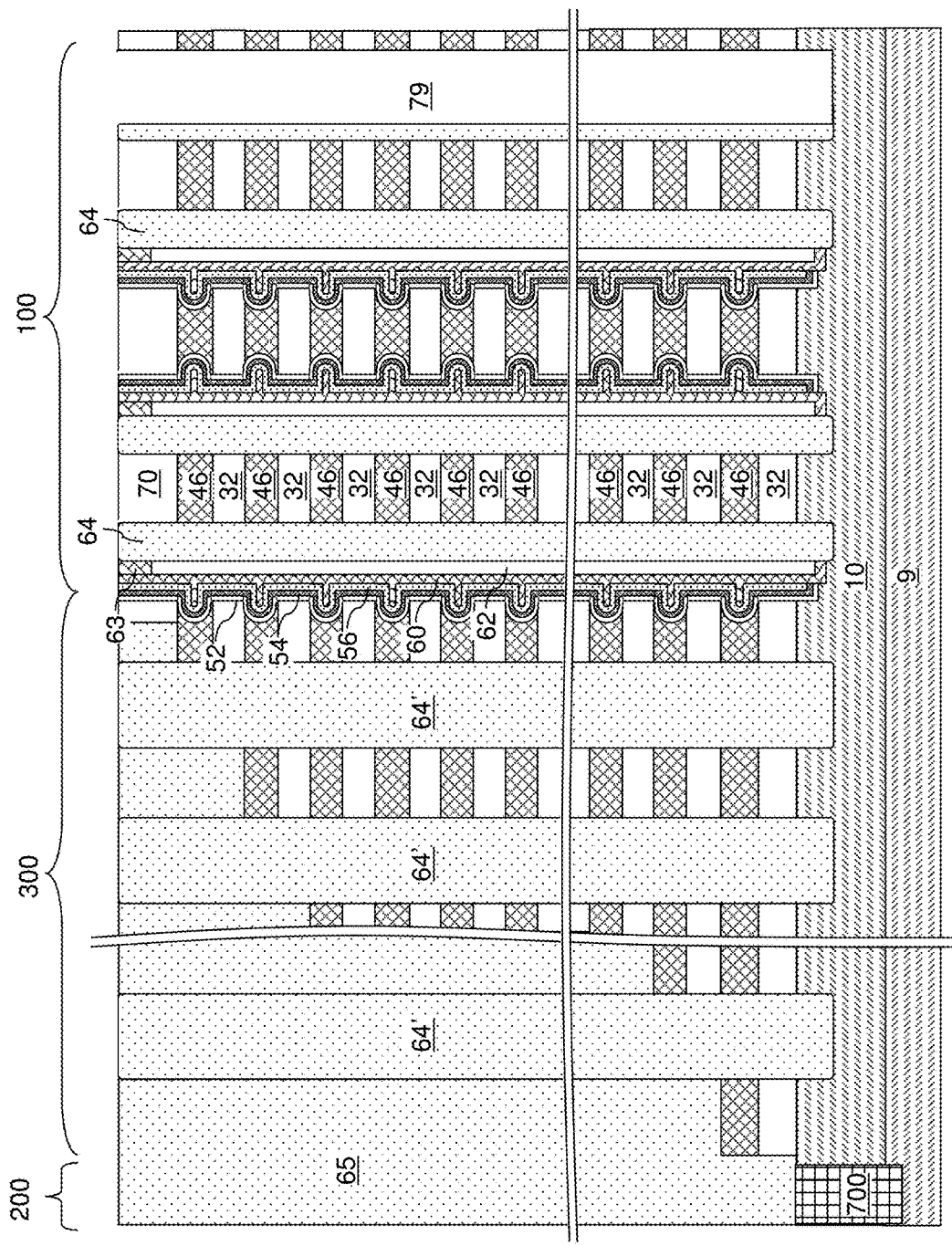
FIG. 16A is a schematic vertical cross-sectional view of the exemplary structure after formation of electrically conductive strips in the backside recesses according to an embodiment of the present disclosure.
Figure 16B:
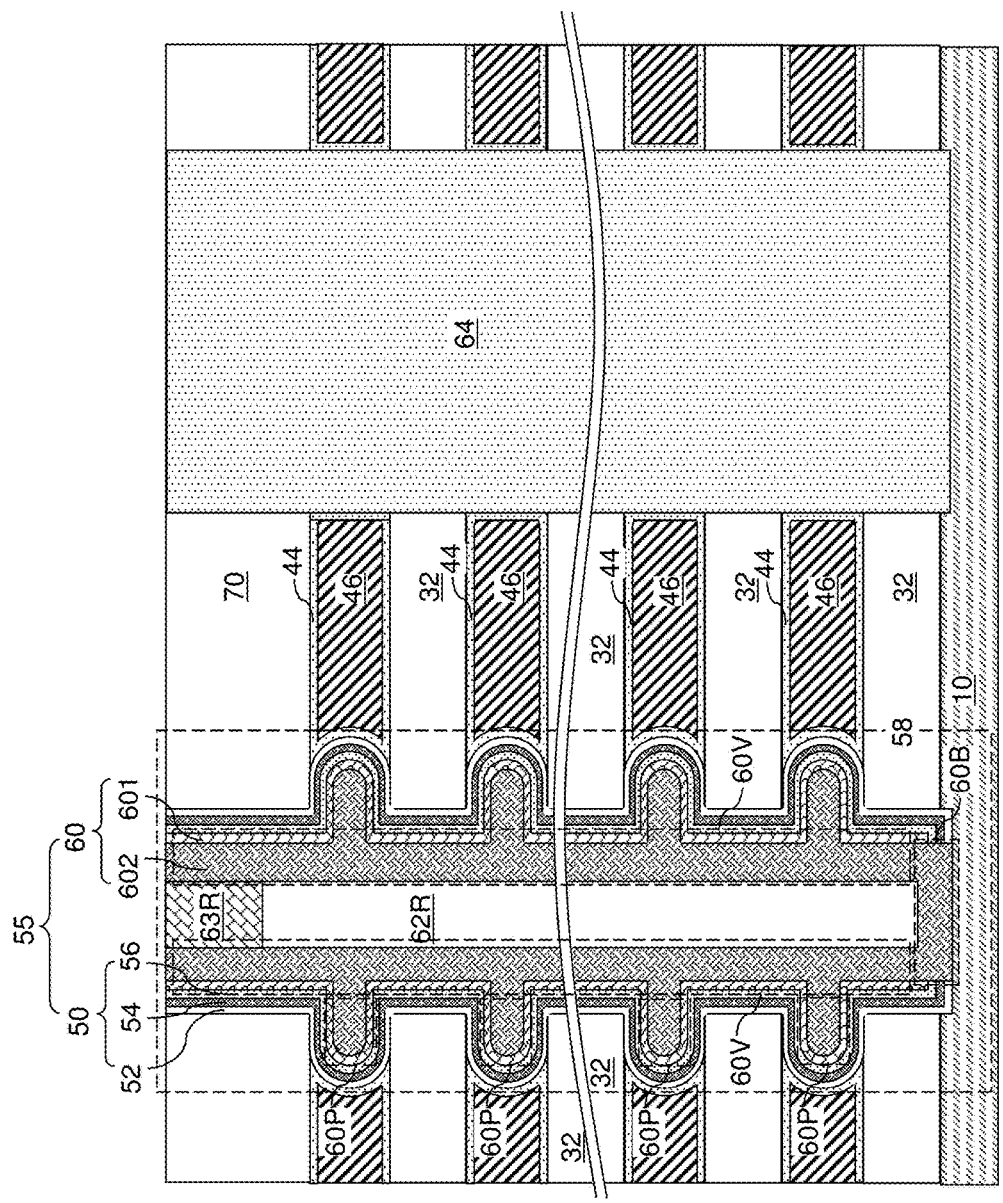
FIG. 16B is a schematic vertical cross-sectional view of a region of the exemplary structure after formation of a backside blocking dielectric layer and electrically conductive strips in the backside recesses according to an embodiment of the present disclosure.

Referring to FIGS. 16A and 16B, a backside blocking dielectric layer 44 can be optionally formed in the backside recesses 43 by a conformal deposition process. The backside blocking dielectric layer 44 is not expressly illustrated in FIG. 16A for simplicity, and is expressly illustrated in FIG. 16B. For example, the backside blocking dielectric layer 44 can include a dielectric metal oxide such as aluminum oxide. The conformal deposition process can include, for example, an atomic layer deposition (ALD) process. The thickness of the backside blocking dielectric layer 44 can be in a range from 1 nm to 6 nm, although lesser and greater thicknesses can also be employed.

At least one conductive material can be deposited in remaining volumes of the backside recesses 43. For example, a metallic barrier layer can be deposited in the backside recesses 43 directly on the physically exposed surfaces of the backside blocking dielectric layer 44, or on the physically exposed surfaces of the blocking dielectrics 52 and the insulating strips 32 in case a backside blocking dielectric layer is not employed. The metallic barrier layer includes an electrically conductive metallic material that can function as a diffusion barrier layer and/or adhesion promotion layer for a metallic fill material to be subsequently deposited. The metallic barrier layer can include a conductive metallic nitride material such as TiN, TaN, WN, or a stack thereof, or can include a conductive metallic carbide material such as TiC, TaC, WC, or a stack thereof. In one embodiment, the metallic barrier layer can be deposited by a conformal deposition process such as chemical vapor deposition (CVD) or atomic layer deposition (ALD). The thickness of the metallic barrier layer can be in a range from 2 nm to 8 nm, such as from 3 nm to 6 nm, although lesser and greater thicknesses can also be employed. In one embodiment, the metallic barrier layer can consist essentially of a conductive metal nitride such as TiN.

A metal fill material is deposited in remaining volumes of backside recesses 43, on the sidewalls of the at least one the backside via cavity 79, and over the top surface of the insulating cap layer 70 to form a metallic fill material portion. The metallic fill material can be deposited by a conformal deposition method, which can be, for example, chemical vapor deposition (CVD), atomic layer deposition (ALD), electroless plating, electroplating, or a combination thereof. In one embodiment, the metallic fill material portion can consist essentially of at least one elemental metal. The at least one elemental metal of the metallic fill material portion can be selected, for example, from tungsten, cobalt, ruthenium, titanium, and tantalum. In one embodiment, the metallic fill material portion can consist essentially of a single elemental metal. In one embodiment, the metallic fill material portion can be deposited employing a fluorine-containing precursor gas such as $WF_6$. In one embodiment, the metallic fill material portion can be a tungsten layer including a residual level of fluorine atoms as impurities.

A plurality of electrically conductive strips 46 (i.e., electrically conductive strips having strip shapes) can be formed in the plurality of backside recesses 43, and a continuous metallic material layer can be formed on the sidewalls of each backside via cavity 79 and over the insulating cap layer 70. Each electrically conductive strip 46 includes a portion of the metallic barrier layer and a metallic fill material portion that are located between a vertically neighboring pair of dielectric material strips such as a pair of insulating strips 32.

The deposited metallic material of the continuous electrically conductive material layer is etched back from the sidewalls of each backside via cavity 79 and from above the insulating cap layer, for example, by an isotropic wet etch, an anisotropic dry etch, or a combination thereof. Each remaining portion of the deposited metallic material in the backside recesses 43 constitutes an electrically conductive strip 46. Each electrically conductive strip 46 can be a conductive line structure. Thus, the sacrificial material strips 42 are replaced with the electrically conductive strips 46.

Each electrically conductive strip 46 can function as a combination of a plurality of control gate electrodes located at a same level and a word line electrically interconnecting, i.e., electrically shorting, the plurality of control gate electrodes located at the same level. The plurality of control gate electrodes within each electrically conductive strip 46 are the control gate electrodes for the vertical memory devices including the memory stack structures 55. In other words, each electrically conductive strip 46 can be a word line that functions as a common control gate electrode for the plurality of vertical memory devices.

While the present disclosure is described employing an embodiment in which the spacer material layers are formed as sacrificial material layers 42, embodiments are expressly contemplated herein in which the spacer material layers are formed as electrically conducive layers, and are divided into electrically conductive strips 46. In one embodiment, division of a vertically alternating sequence into multiple alternating stacks of insulating strips 32 and electrically conductive strips 46 can occur upon formation of the line trenches 49 (i.e., at the processing steps of FIGS. 4A and 4B in case the line trenches 49 extend through the entire length of the contact region 300 along the first horizontal direction hd1). In another embodiment, division of a vertically alternating sequence into multiple alternating stacks of insulating strips 32 and electrically conductive strips 46 can occur upon formation of the discrete via cavities 69 and the elongated via cavities 69' (i.e., at the processing steps of FIGS. 12A-12D in case the line trenches 49 do not completely divide the vertically alternating sequence of insulating layers 32 and electrically conductive strips into multiple alternating stacks (32, 46) of insulating strips 32 and electrically conductive strips 46).

In one embodiment, the vertical semiconductor channel 60 comprises a pair of vertically-extending portions 60V, a bottom portion 60B that connects bottom ends of the pair of vertically-extending portions 60V, and laterally-protruding portions 60P located at each level of the electrically conductive strips 46 and extending away from the pair of vertically-extending portions 60V. In one embodiment, each of the laterally-protruding portions 60P includes a horizontal top surface contacting a horizontal bottom surface of the memory film 50, a horizontal bottom surface contacting a horizontal top surface of the memory film 50, and a convex sidewall adjoined to the horizontal top surface of the memory film 50 and to the horizontal bottom surface of the memory film 50.

Figure 16C:
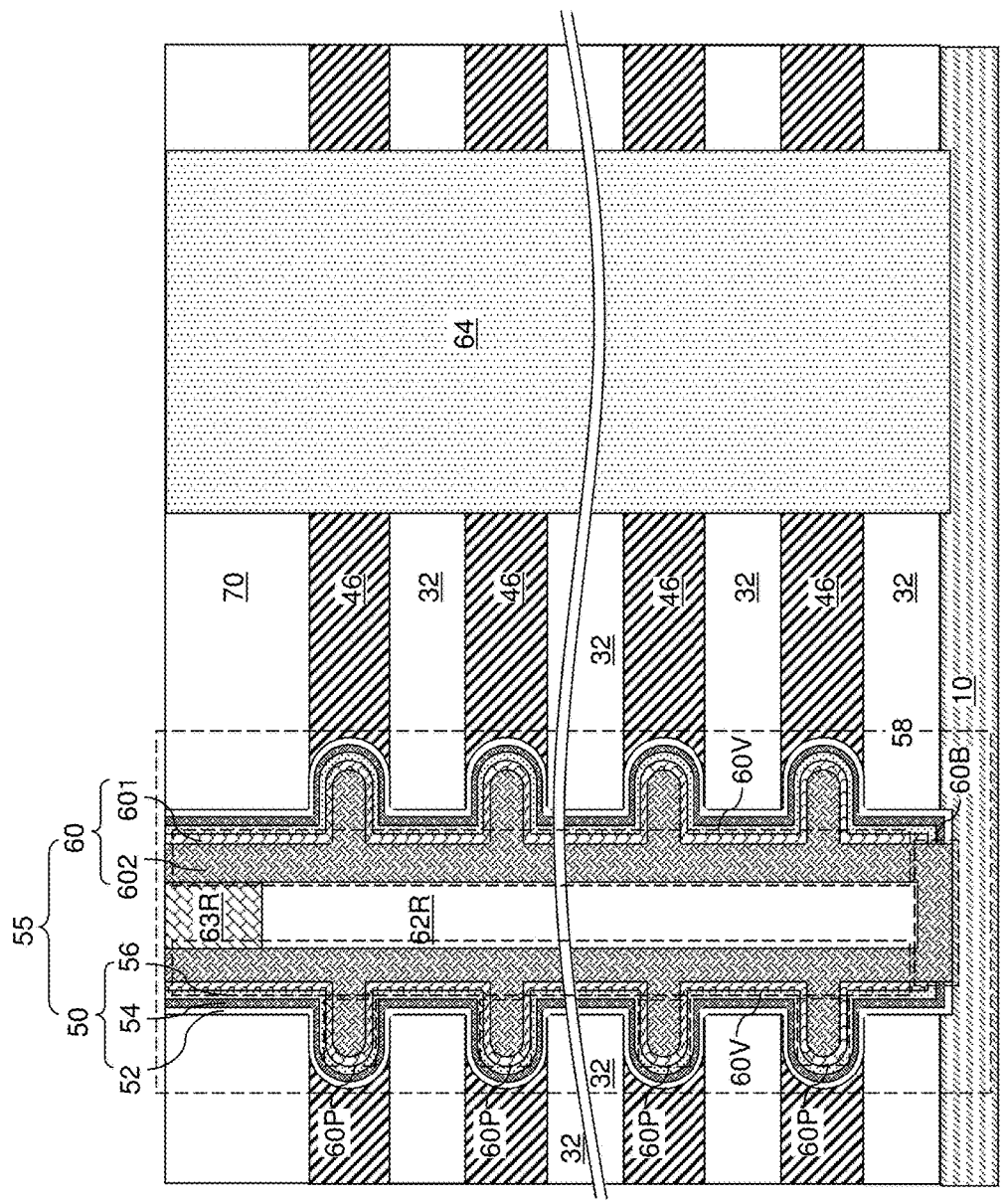
FIG. 16C is a schematic vertical cross-sectional view of a region of an alternative configuration of the exemplary structure after formation of electrically conductive strips in the backside recesses according to an embodiment of the present disclosure.

Referring to FIG. 16C, an embodiment is illustrated in which the backside blocking dielectric layer is not present. In this case, the electrically conductive strips 46 can be formed directly on the outer surfaces of the blocking dielectrics 52.

Generally, each memory stack assembly 58 comprises a vertical semiconductor channel 60 and a pair of memory films 50 including a respective pair of convex outer sidewalls that contact, or are spaced by a uniform distance from, concave sidewalls of the electrically conductive strips 46. The convex outer sidewalls of the memory films 50 contact the electrically conductive strips 46 in case the backside blocking dielectric layer 44 is not employed. The convex outer sidewalls of the memory films 50 are spaced from the electrically conductive strips 46 by the thickness of the backside blocking dielectric layer 44 in case the backside blocking dielectric layer 44 is employed. The concave sidewalls of the electrically conductive strips 46 and the convex surfaces of the laterally protruding portions of the vertical semiconductor channels 60 provides a geometry that locally increases the density of electrical field lines at a tip of each laterally protruding portion upon application of electrical bias to a most proximal one of the electrically conductive strips 46. The electrically conductive strip (e.g., word line/control gate electrode) 46 has a matching concave sidewall surface profile for a given laterally protruding portion of the vertical semiconductor channel 60 and is laterally spaced from the laterally protruding portion by the thickness of the backside blocking dielectric layer 44.

Figure 17:
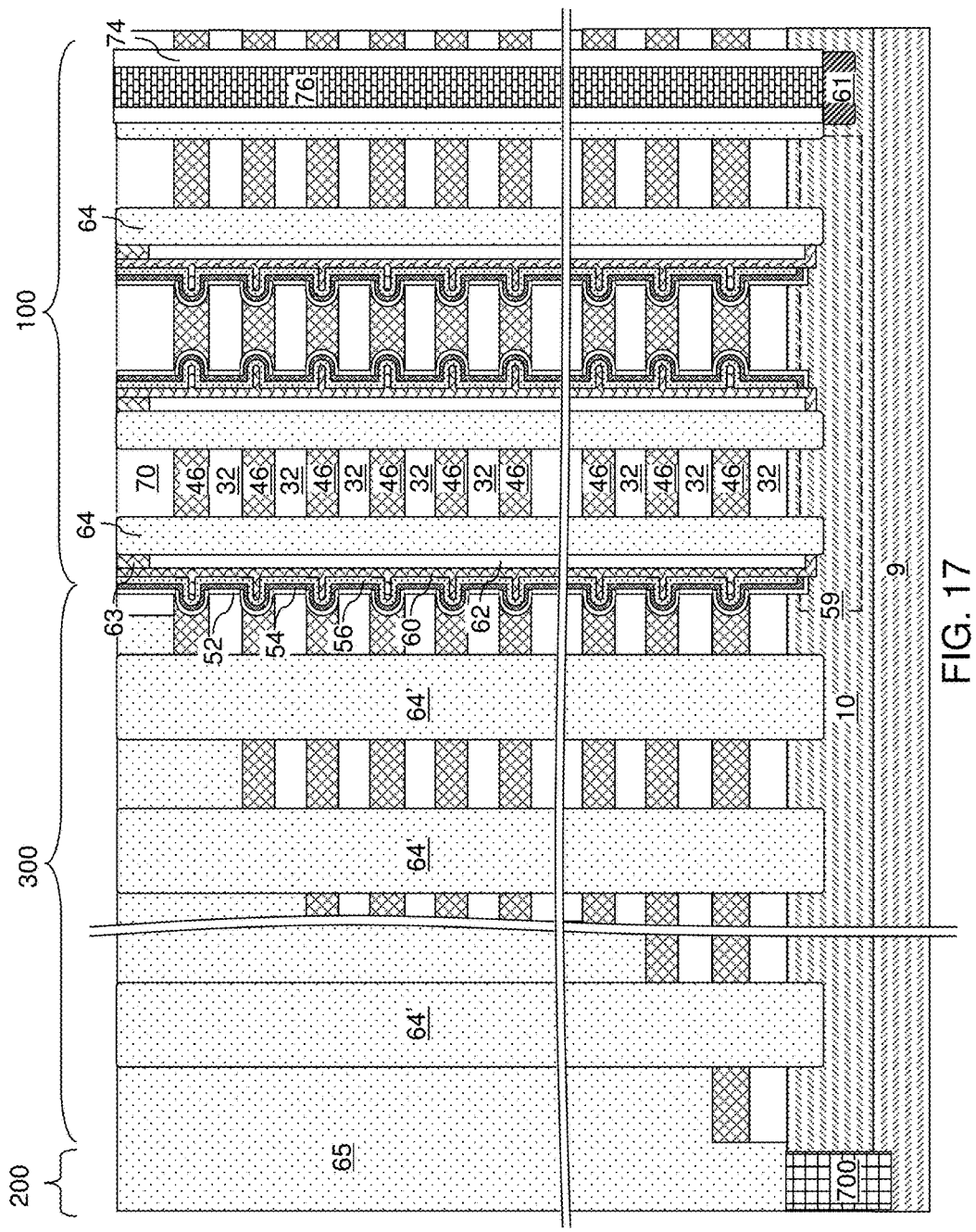
FIG. 17 is a schematic vertical cross-sectional view of the exemplary structure after formation of source regions, insulating spacers, and backside contact via structures according to an embodiment of the present disclosure.

Referring to FIG. 17, an insulating material layer can be formed in the at least one backside via cavity 79 and over the insulating cap layer 70 by a conformal deposition process. Exemplary conformal deposition processes include, but are not limited to, chemical vapor deposition and atomic layer deposition. The insulating material layer includes an insulating material such as silicon oxide, silicon nitride, a dielectric metal oxide, an organosilicate glass, or a combination thereof. In one embodiment, the insulating material layer can include silicon oxide. The insulating material layer can be formed, for example, by low pressure chemical vapor deposition (LPCVD) or atomic layer deposition (ALD). The thickness of the insulating material layer can be in a range from 1.5 nm to 60 nm, although lesser and greater thicknesses can also be employed.

An anisotropic etch is performed to remove horizontal portions of the insulating material layer from above the insulating cap layer 70 and at the bottom of each backside via cavity 79. Each remaining portion of the insulating material layer constitutes an insulating spacer 74. A backside void is present within a volume surrounded by each insulating spacer 74. A top surface of the semiconductor material layer 10 can be physically exposed at the bottom of each backside void.

A source region 61 can be formed at a surface portion of the semiconductor material layer 10 under each backside void by implantation of electrical dopants into physically exposed surface portions of the semiconductor material layer 10. Each source region 61 is formed in a surface portion of the substrate (9, 10) that underlies a respective opening through the insulating spacer 74. Due to the straggle of the implanted dopant atoms during the implantation process and lateral diffusion of the implanted dopant atoms during a subsequent activation anneal process, each source region 61 can have a lateral extent greater than the lateral extent of the opening through the insulating spacer 74.

Each surface portion of the semiconductor material layer 10 located between a source region 61 and neighboring bottom ends of the vertical semiconductor channels 60 constitutes a horizontal semiconductor channel 59. Each horizontal semiconductor channel 59 contacts the source region 61 and a plurality of vertical semiconductor channels 60. Each source region 61 is formed in an upper portion of the semiconductor substrate (9, 10). Semiconductor channels (59, 60) extend between each source region 61 and a respective set of drain regions 63. The semiconductor channels (59, 60) include the vertical semiconductor channels 60 of the memory stack structures 55.

A backside contact via structure 76 can be formed within each backside voids. Each contact via structure 76 can fill a respective backside void. The contact via structures 76 can be formed by depositing at least one conductive material in the remaining unfilled volumes of the backside via cavities 79. For example, the at least one conductive material can include a conductive liner and a conductive fill material portion. The conductive liner can include a conductive metallic liner such as TiN, TaN, WN, TiC, TaC, WC, an alloy thereof, or a stack thereof. The thickness of the conductive liner can be in a range from 3 nm to 30 nm, although lesser and greater thicknesses can also be employed. The conductive fill material portion can include a metal or a metallic alloy. For example, the conductive fill material portion can include W, Cu, Al, Co, Ru, Ni, an alloy thereof, or a stack thereof.

The at least one conductive material can be planarized employing the insulating cap layer 70 overlying the alternating stacks (32, 46) as a stopping layer. If chemical mechanical planarization (CMP) process is employed, the insulating cap layer 70 can be employed as a CMP stopping layer. Each remaining continuous portion of the at least one conductive material in the backside via cavities 79 constitutes a backside contact via structure 76. Each backside contact via structure 76 extends through the alternating stacks (32, 46), and contacts a top surface of a respective source region 61. Alternatively, a horizontal source line can be located under the alternating stacks (32, 46) in electrical contact with the lower parts of the vertical semiconductor channels 60.

Figure 18A:
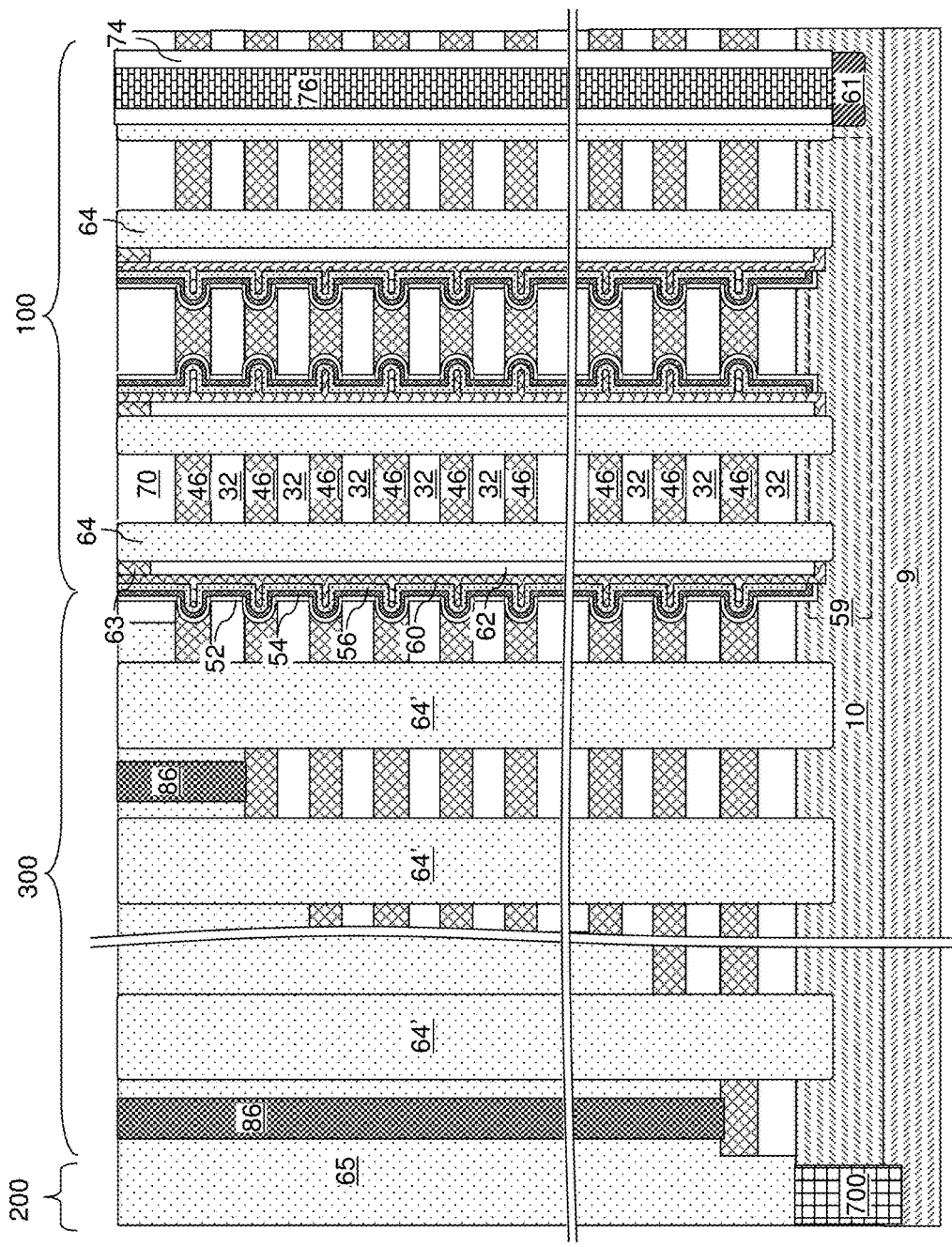
FIG. 18A is a schematic vertical cross-sectional view of the exemplary structure after formation of word line contact via structures according to an embodiment of the present disclosure.
Figure 18B:
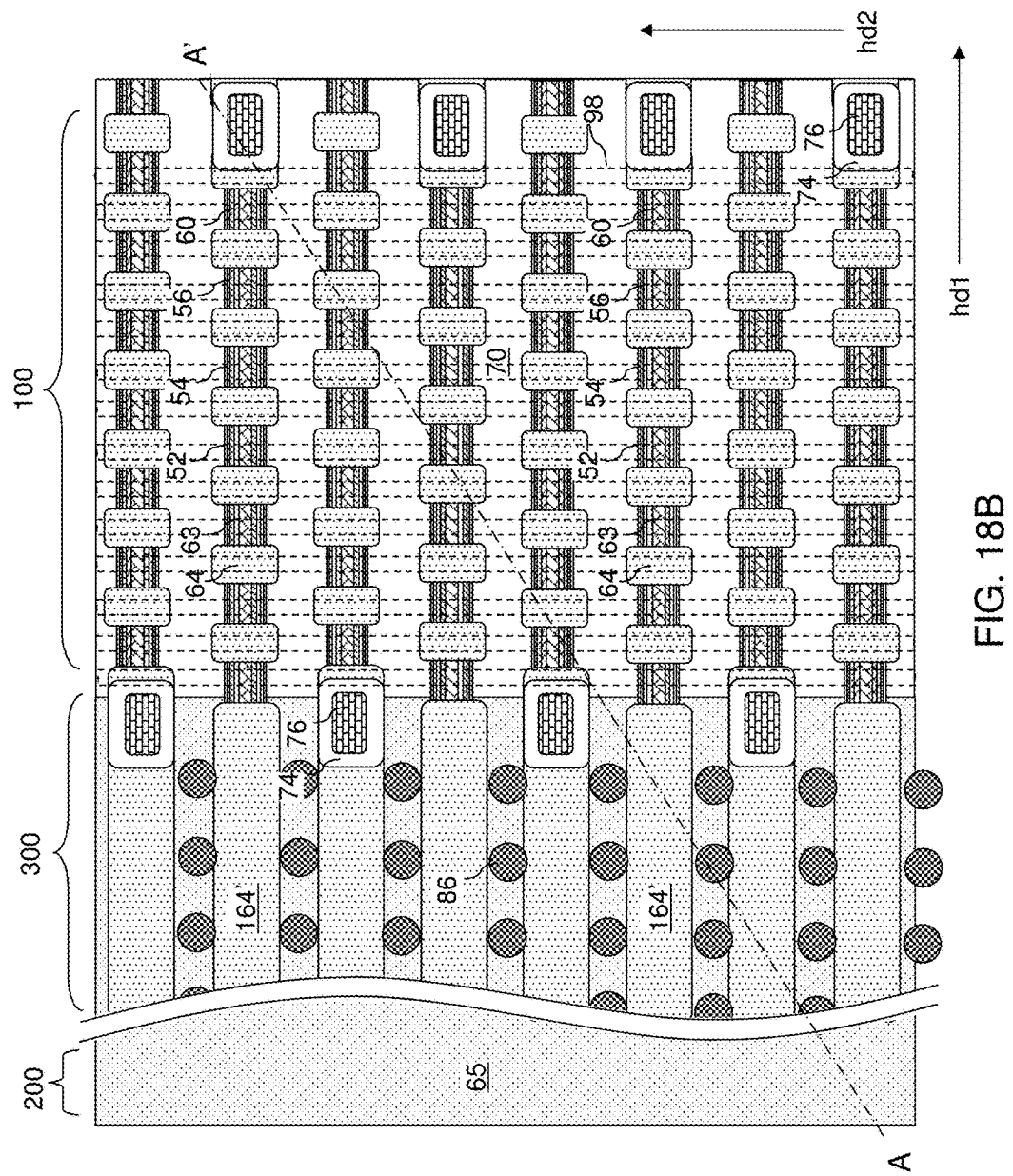
FIG. 18B is a top-down view of the exemplary structure of FIG. 18A. The vertical plane A-A' is the plane of the cross-section for FIG. 18A.

Referring to FIGS. 18A and 18B, contact via structures 86 (which are herein referred to as word line contact via structures) can be formed on the electrically conductive strips 46 through the retro-stepped dielectric material portion 65. A two-dimensional array of contact via structures 86 can be formed on a top surface of a respective one of the electrically conductive strips 46 in the contact region 300.

Additional contact via structures and additional dielectric material layers can be formed over the insulating cap layer 70. For example, drain contact via structures (not expressly illustrated) can be formed on a top surface of each drain region 63 within the active memory stack assemblies 58 (i.e., memory stack assemblies 58 that are not employed as dummy structures and are electrically active). Bit lines 98 can be formed to electrically contact every other drain region 63 along the second horizontal direction hd2, i.e., a respective set of drain regions 63 located within every other line trench 49 along the second horizontal direction. An exemplary layout for the bit lines 98 is illustrated in FIG. 16B. In this configuration, each electrically conductive strip 46, functioning as a word line, activates only a single portion of the memory cell (e.g., a single portion of the memory film 50) per bit line 98, and can program or read the uniquely selected memory cell corresponding to a single activated portion of one of the memory films 50.

FIGS. 19A-19D illustrate schematic vertical cross-sectional views of a method of forming a second exemplary structure according to a second embodiment of the present disclosure. The structure of FIG. 19A corresponds to the structure shown in FIGS. 6A and 6B of the first embodiment.

Figure 19D:
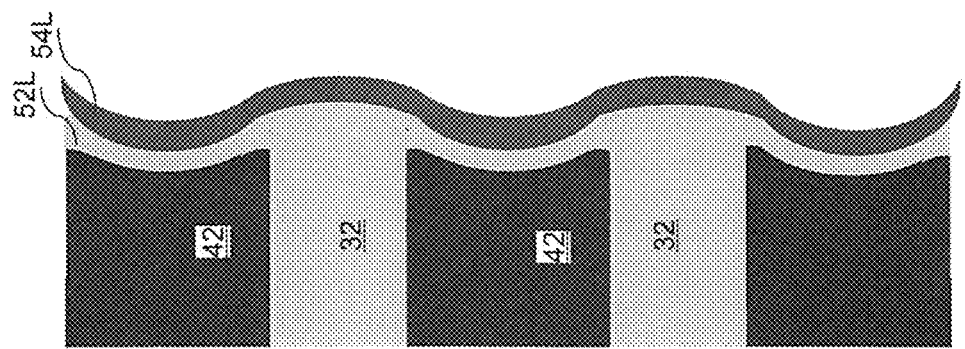
FIGS. 19A-19D are schematic vertical cross-sectional views of a method of forming a second exemplary structure according to a second embodiment of the present disclosure.
Figure 19C:
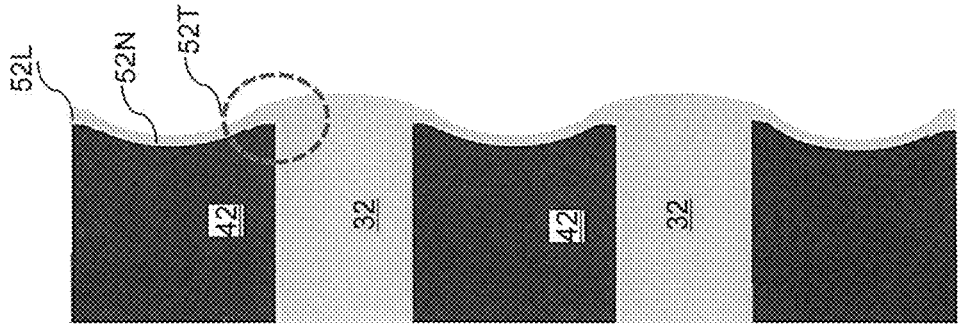
Figure 19B:
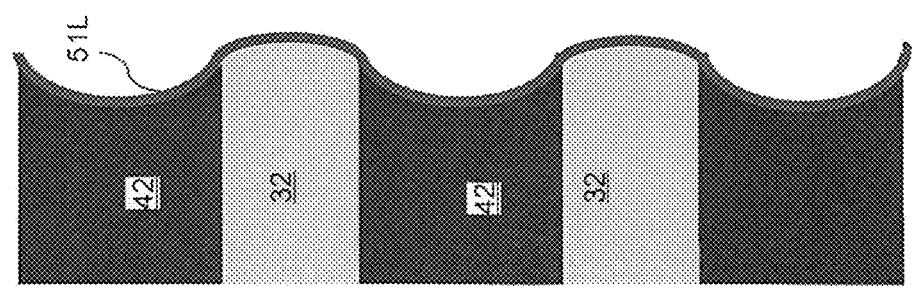
Figure 19A:
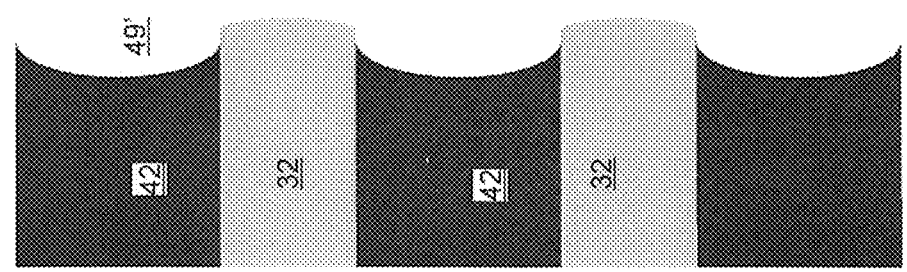

As shown in FIG. 19B, a silicon nitride layer 51L is formed on the sidewalls of the vertically undulating trenches 49'. The silicon nitride layer 51L follows the contours of the vertically undulating trenches 49'.

As shown in FIG. 19C, the silicon nitride layer 51L is oxidized to convert the silicon nitride layer 51L into a silicon oxide or silicon oxynitride continuous blocking dielectric layer 52L. Any suitable oxidation, such as plasma oxidation or thermal oxidation may be used. The continuous blocking dielectric layer 52L has a non-uniform thickness in the vertical direction, with thicker regions 52T located adjacent to the interface between the sacrificial material layers 42 and insulating layers 32, and thinner regions 52N located adjacent to the middle of each sacrificial material layer 42. Without wishing to be bound by a particular theory, it is believed that oxygen radicals are provided from both the silicon nitride layer 51L and the silicon oxide insulating layers 32 to form the thicker regions 52T, while oxygen radicals are provided only from the silicon nitride layer 51L to form the thinner regions 52N.

As shown in FIG. 19D, the continuous charge storage layer 54L is formed on the continuous blocking dielectric layer 52L. The process then proceeds as described above with respect to FIGS. 7A and 7B and optionally also with respect to FIGS. 8A and 8B.

FIGS. 20A-20C illustrate a subsequent step in the method of forming the second exemplary structure according to the second embodiment of the present disclosure. An optional source select gate electrode layer 47, such as a heavily doped silicon layer can be formed under the vertically alternating sequence of insulating layers and sacrificial material layers (32, 42). A sacrificial material 66 is deposited into the remaining unfilled portions of the vertically undulating trenches 49'. The sacrificial material 66 fills the entire remaining unfilled portions of the trenches 49'. The sacrificial material 66 may be any material than can be removed selective to the underlying semiconductor channel material. For example, the sacrificial material 66 may comprise carbon doped silicon oxide or amorphous carbon, for example.

As shown in FIGS. 21A-21C, the above described discrete isolation cavities 69 (also referred to as "pillar cavities") are formed in rows that overlap with the areas of the continuous memory film layer 50L, the continuous channel layer 60L (which can include the continuous cover material layer 601L) and the sacrificial material 66, using the method described above with respect to FIGS. 12A-12D. The portions of the continuous memory film layer 50L and the continuous channel layer 60L are removed from the pillar cavities 69 after etching away the sacrificial material 66 at the location of the pillar cavities 69.

Figures 22A, 22B, 22C:
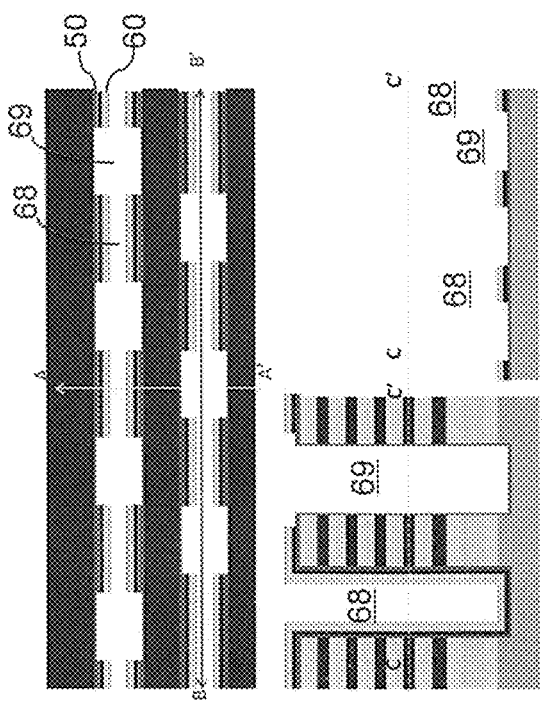
FIGS. 22A and 22B are schematic vertical cross-sectional views of a subsequent step in a method of forming the second exemplary structure according to the second embodiment of the present disclosure along vertical planes A-A' and B-B', respectively in FIG. 22C.
FIG. 22C is a side cross-cross sectional view of the second exemplary structure along plane C-C' in FIGS. 22A and 22B.

As shown in FIGS. 22A-22C, the remainder of the sacrificial material 66 is removed from the portions 68 of the vertically undulating trenches 49' located between the pillar cavities 69. The continuous channel layer 60L is exposed in the portions of the vertically undulating trenches 49' located between the pillar cavities 69. The continuous memory film layer 50L is located under the continuous channel layer 60L in the portions of the vertically undulating trenches 49' located between the pillar cavities 69.

Figures 23A, 23B, 23C:
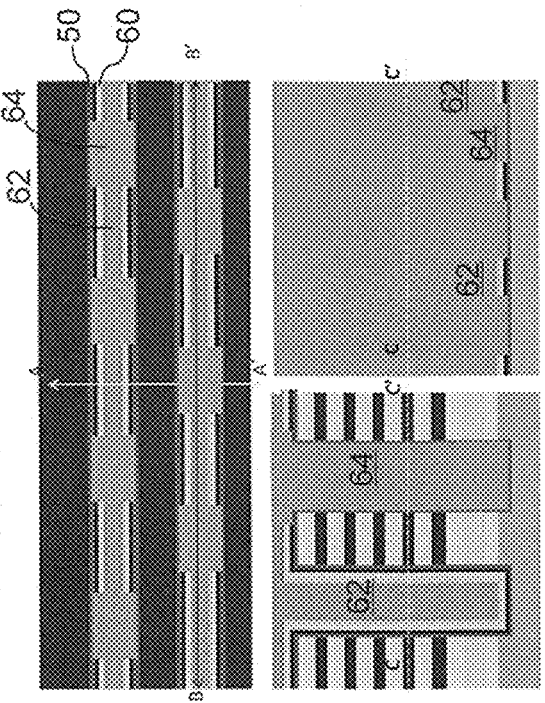
FIGS. 23A and 23B are schematic vertical cross-sectional views of a subsequent step in a method of forming the second exemplary structure according to the second embodiment of the present disclosure along vertical planes A-A' and B-B', respectively in FIG. 23C.
FIG. 23C is a side cross-cross sectional view of the second exemplary structure along plane C-C' in FIGS. 23A and 23B.

As shown in FIGS. 23A-23C, an insulating material, such as silicon oxide is formed in the pillar cavities 69 and in the portions 68 of the vertically undulating trenches 49' located between the pillar cavities 69 during the same deposition and planarization steps. The insulating material forms the above described dielectric pillar structures 64 in the pillar cavities 69 and the above described dielectric cores 62 in the portions 68 of the vertically undulating trenches 49'. Drain regions 63 may then be formed as described above with respect to the first embodiment. The method of the second embodiment then proceeds as described above with respect to FIGS. 14A to 18B of the first embodiment.

Figure 24:
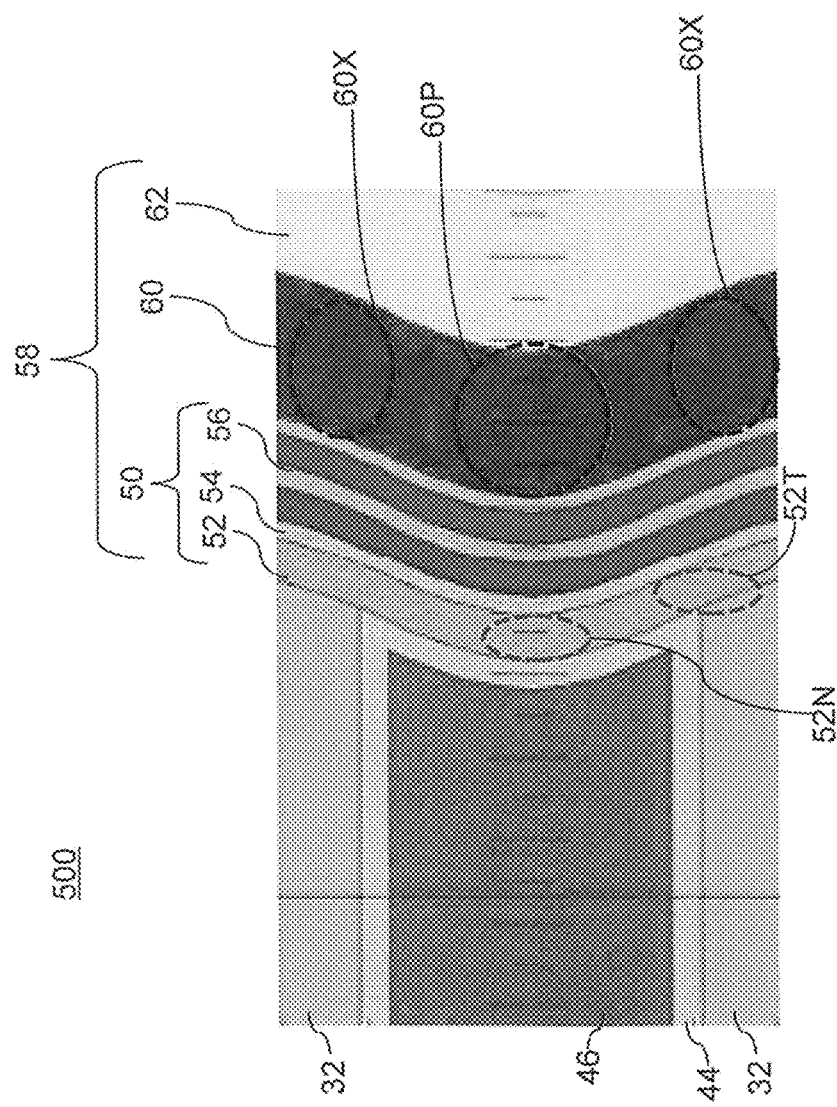
FIG. 24 is a schematic vertical cross-sectional view of a memory cell according to the second embodiment of the present disclosure.

FIG. 24 illustrates a memory cell 500 of the second embodiment. In the second embodiment, the sidewalls of the portions 68 of the vertically undulating trenches 49' are continuous undulating without any straight vertical portions, as shown in FIG. 19D due to the formation of the silicon nitride layer 51L and oxidation of the silicon nitride layer 51L to form the continuously undulating blocking dielectric layer 52L. Thus, in this embodiment, the vertical semiconductor channel 60 does not contain the vertically-extending portions 60V. Instead, in this embodiment, the vertical semiconductor channel 60 contains alternating laterally-protruding portions 60P located at each level of the electrically conductive strips (e.g., word lines/control gate electrodes) 46 and curved laterally-recessed portions 60X located at each level of the insulating layers 32 and extending away from the adjacent laterally-protruding portions 60P. In this embodiment, each of the laterally-protruding portions 60P includes does not include any horizontal surfaces.

Referring to all drawings and according to various embodiments of the present disclosure, a three-dimensional memory device is provided, which comprises: alternating stacks of insulating strips 32 and electrically conductive strips 46 located over a substrate (9, 10) and laterally spaced apart among one another by vertically undulating trenches 49', wherein the vertically undulating trenches 49' laterally extend along a first horizontal direction hd1 and are spaced apart along a second horizontal direction hd2 and have a greater lateral extent along the second horizontal direction hd2 at levels of the electrically conductive strips 46 than at levels of the insulating strips 32; and an interlaced two-dimensional array of memory stack assemblies 58 and dielectric pillar structures 64 located in the vertically undulating trenches 49', wherein each of the vertically undulating trenches 49' is filled with a respective laterally alternating sequence of memory stack assemblies 58 and dielectric pillar structures 64, wherein each memory stack assembly 58 comprises a vertical semiconductor channel 60 and a pair of memory films 60 including a respective pair of convex outer sidewalls that contact, or are spaced by a uniform distance from, concave sidewalls of the electrically conductive strips 46.

In the second embodiment illustrated in FIG. 24, the vertical semiconductor channel 60 contains alternating laterally-protruding portions 60P located at each level of the electrically conductive strips 46 and curved laterally-recessed portions 60X located at each level of the insulating layers 32. Each memory film 50 contains a blocking dielectric 52 having non-uniform thickness in the vertical direction, and comprising thicker regions 52T located adjacent to an interface between the electrically conductive strips 46 and the insulating layers 32, and thinner regions 52N located adjacent to a middle of each electrically conductive strip 46.

In one embodiment, each concave sidewall of the electrically conductive strips 46 extends along the first horizontal direction hd1 with a vertical cross-sectional profile in vertical planes that are perpendicular to the first horizontal direction hd1, and the vertical cross-sectional profile can be invariant with translation along the first horizontal direction hd1.

In one embodiment, each convex outer sidewall of the memory films 50 directly contacts a respective one of the concave sidewalls of the electrically conductive strips 46.

In one embodiment, each convex outer sidewall of the memory films 50 is spaced from a respective one of the concave sidewalls of the electrically conductive strips 46 by a respective backside blocking dielectric layer 44 having a uniform thickness and including an upper horizontal portion overlying the respective one of the concave sidewalls of the electrically conductive strips 46 and a lower horizontal portion underlying the respective one of the concave sidewalls of the electrically conductive strips 46.

In one embodiment, each memory stack assembly 58 comprises a drain region 63 contacting a top portion of a respective one of the vertical semiconductor channels 60, and a dielectric core 62 contacting inner sidewalls of a respective vertical semiconductor channel 60, underlying the drain region 63, and laterally contacting a respective pair of dielectric pillar structures 64.

In one embodiment, each of the memory films 50 includes a tunneling dielectric 56 contacting a respective one of the vertical semiconductor channels 60, a charge storage layer 54 contacting the tunneling dielectric 56, and a blocking dielectric 52 contacting the charge storage layer 54.

In one embodiment, each memory stack assembly 58 includes a respective vertical semiconductor channel 60, a respective pair of tunneling dielectrics 56, a respective pair of charge storage layers 54, and a respective pair of blocking dielectrics 52. Each of the respective vertical semiconductor channel 60, the respective pair of tunneling dielectrics 56, the respective pair of charge storage layers 54, and the respective pair of blocking dielectrics 52 contacts sidewalls of a respective pair of dielectric pillar structures 64 that laterally extend along the second horizontal direction hd2.

In one embodiment, the three-dimensional memory device comprises: a contact region 300 in which each alternating stack (32, 46) has respective stepped surfaces that extend from the substrate (9, 10) to a topmost strip within a respective alternating stack (32, 46), and a two-dimensional array of contact via structures 86 contacting a top surface of a respective one of the electrically conductive strips 46 within the alternating stacks (32, 46) in the contact region 300.

In one embodiment, the dielectric pillar structures 64 have a greater width along the second horizontal direction hd2 than a maximum lateral dimension of the memory stack assemblies 58 along the second horizontal direction hd2.

In one embodiment, the three-dimensional memory device comprises: a horizontal semiconductor channel 59 adjoined to bottom portions of the vertical semiconductor channels 60 and located in an upper portion of the substrate (9, 10), a source region 61 laterally contacting the horizontal semiconductor channel 59 and located in the upper portion of the substrate (9, 10), and a backside contact via structure 76 located between a neighboring pair of alternating stacks (32, 46) and contacting the source region 61.

The three-dimensional memory device of the embodiments of the present disclosure provides faster programming and erase speeds through local enhancement of electrical field line density, and thus, enhanced local electrical field strength. A matching pair of a concave sidewall of an electrically conductive strip (i.e., word line/control gate electrode) 46 and a convex sidewall of a laterally protruding portion of a vertical semiconductor channel 60 provides a geometry in which the local electrical field strength increases.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A three-dimensional memory device comprising:
    alternating stacks of insulating strips and electrically conductive strips located over a substrate and laterally spaced apart among one another by vertically undulating trenches, wherein the vertically undulating trenches laterally extend along a first horizontal direction and are spaced apart along a second horizontal direction and have a greater lateral extent along the second horizontal direction at levels of the electrically conductive strips than at levels of the insulating strips; and
    an interlaced two-dimensional array of memory stack assemblies and dielectric pillar structures located in the vertically undulating trenches, wherein each of the vertically undulating trenches is filled with a respective laterally alternating sequence of memory stack assemblies and dielectric pillar structures,
    wherein each memory stack assembly comprises a vertical semiconductor channel and a pair of memory films including a respective pair of convex outer sidewalls that contact, or are spaced by a uniform distance from, concave sidewalls of the electrically conductive strips.

2. The three-dimensional memory device of claim 1, wherein the vertical semiconductor channel comprises:
    a pair of vertically-extending portions;
    a bottom portion that connects bottom ends of the pair of vertically-extending portions; and
    laterally-protruding portions located at each level of the electrically conductive strips and extending away from the pair of vertically-extending portions.

3. The three-dimensional memory device of claim 1, wherein the vertical semiconductor channel contains alternating laterally-protruding portions located at each level of the electrically conductive strips and curved laterally-recessed portions located at each level of the insulating layers.

4. The three-dimensional memory device of claim 3, wherein each memory film contains a blocking dielectric having non-uniform thickness in the vertical direction, and comprising thicker regions located adjacent to an interface between the electrically conductive strips and the insulating layers, and thinner regions located adjacent to a middle of each electrically conductive strip.

5. The three-dimensional memory device of claim 1, wherein each convex outer sidewall of the memory films directly contacts a respective one of the concave sidewalls of the electrically conductive strips.

6. The three-dimensional memory device of claim 1, wherein each convex outer sidewall of the memory films is spaced from a respective one of the concave sidewalls of the electrically conductive strips by a respective backside blocking dielectric layer having a uniform thickness and including an upper horizontal portion overlying the respective one of the concave sidewalls of the electrically conductive strips and a lower horizontal portion underlying the respective one of the concave sidewalls of the electrically conductive strips.

7. The three-dimensional memory device of claim 1, wherein each memory stack assembly comprises:
a drain region contacting a top portion of a respective one of the vertical semiconductor channels; and
a dielectric core contacting inner sidewalls of a respective vertical semiconductor channel, underlying the drain region, and laterally contacting a respective pair of dielectric pillar structures.

8. The three-dimensional memory device of claim 1, wherein each of the memory films includes a tunneling dielectric contacting a respective one of the vertical semiconductor channels, a charge storage layer contacting the tunneling dielectric, and a blocking dielectric contacting the charge storage layer.

9. The three-dimensional memory device of claim 8, wherein:
each memory stack assembly includes a respective vertical semiconductor channel, a respective pair of tunneling dielectrics, a respective pair of charge storage layers, and a respective pair of blocking dielectrics; and
each of the respective vertical semiconductor channel, the respective pair of tunneling dielectrics, the respective pair of charge storage layers, and the respective pair of blocking dielectrics contacts sidewalls of a respective pair of dielectric pillar structures that laterally extend along the second horizontal direction.

10. The three-dimensional memory device of claim 1, further comprising:
a contact region in which each alternating stack has respective stepped surfaces that extend from the substrate to a topmost strip within a respective alternating stack; and
a two-dimensional array of contact via structures contacting a top surface of a respective one of the electrically conductive strips within the alternating stacks in the contact region.

11. The three-dimensional memory device of claim 1, wherein the dielectric pillar structures have a greater width along the second horizontal direction than a maximum lateral dimension of the memory stack assemblies along the second horizontal direction.

12. The three-dimensional memory device of claim 1, further comprising:
a horizontal semiconductor channel adjoined to bottom portions of the vertical semiconductor channels and located in an upper portion of the substrate;
a source region laterally contacting the horizontal semiconductor channel and located in the upper portion of the substrate; and
a backside contact via structure located between a neighboring pair of alternating stacks and contacting the source region.

13. A method of forming a three-dimensional memory device, comprising:
forming a vertically alternating sequence of insulating layers and sacrificial material layers over a substrate;
forming line trenches laterally extending along a first horizontal direction through the vertically alternating sequence, wherein alternating stacks of insulating strips and sacrificial material strips are formed by remaining portions of the vertically alternating sequence;
forming recessed concave sidewalls on the sacrificial material strips by laterally recessing the sacrificial material strips selective to the insulating strips, wherein the line trenches become vertically undulating trenches having vertically undulating widths within vertical planes perpendicular to the first horizontal direction;
forming an interlaced two-dimensional array of memory stack assemblies and dielectric pillar structures located in the vertically undulating trenches, wherein each of the vertically undulating trenches is filled with a respective laterally alternating sequence of memory stack assemblies and dielectric pillar structures; and
replacing the sacrificial material strips with electrically conductive strips,
wherein each memory stack assembly comprises a vertical semiconductor channel and a pair of memory films including a respective pair of convex outer sidewalls that contact, or are spaced by a uniform distance from, concave sidewalls of the electrically conductive strips.

14. The method of claim 13, further comprising:
forming trench fill structures in the vertically undulating trenches, wherein each trench fill structure comprises a pair of memory film layers and a semiconductor channel material rail; and
forming an array of isolation cavities through the trench fill structures, wherein the trench fill structures are divided into memory stack assemblies, each memory stack assembly including a respective vertical semiconductor channel and a respective memory film.

15. The method of claim 14, wherein the dielectric pillar structures are formed by depositing a dielectric material in the isolation cavities and removing excess portions of the dielectric material from above top surfaces of the memory stack assemblies.

16. The method of claim 14, wherein the trench fill structures are formed by:
forming a continuous memory film layer in the vertically undulating trenches;
removing horizontal portions of the continuous memory film layer by an anisotropic etch, wherein the continuous memory film layer is divided into memory film layers;
depositing a continuous semiconductor channel material layer;
removing portions of the continuous semiconductor channel material layer that overlie the remaining portions of the vertically alternating sequence, wherein remaining portions of the continuous semiconductor channel material layer comprise semiconductor channel material rails.

17. The method of claim 13, wherein:
the insulating layers comprise silicon oxide;
the sacrificial material layers comprise silicon nitride; and
the sacrificial material strips are laterally recessed by a wet etch process employing hot phosphoric acid.

18. The method of claim 13, wherein:
each memory film has a thickness that is less than one half of a minimum thickness of the sacrificial material layers;

each vertical semiconductor channel is formed with a laterally protruding portion at each level of the sacrificial material layers; and the electrically conductive strips and the laterally protruding portions of the vertical semiconductor channels provides a geometry that locally increases a density of electrical field lines at a tip of each laterally protruding portion upon application of electrical bias to a most proximal one of the electrically conductive strips.

19. The method of claim 13, wherein each memory stack assembly comprises:

a drain region contacting a top portion of a vertical semiconductor channel within a respective memory stack assembly; and a dielectric core contacting inner sidewalls of the respective vertical semiconductor channel, underlying the drain region, and laterally contacting a respective pair of dielectric pillar structures.

20. The method of claim 13, further comprising:

forming a trench fill structure comprising a continuous memory film layer, a continuous semiconductor channel layer and a sacrificial material in the vertically undulating trenches;

removing portions of the continuous memory film layer, the continuous semiconductor channel layer and the sacrificial material to form an array of isolation cavities through the trench fill structures, such that the trench fill structures are divided into memory stack assemblies, each memory stack assembly including a respective vertical semiconductor channel and a respective memory film;

removing the sacrificial material from remaining portions of the vertically undulating trenches; and forming an insulating material in the remaining portions of the vertically undulating trenches and in the isolation cavities to form respective dielectric cores of the memory stack assemblies and dielectric pillar structures.

* * * * *